US012698553B2

(12) United States Patent
Kim et al.

(10) Patent No.: US 12,698,553 B2
(45) Date of Patent: Aug. 4, 2026

(54) MASK FOR DEPOSITING EMISSION LAYER, METHOD OF MANUFACTURING THE MASK, AND DISPLAY APPARATUS MANUFACTURED USING THE MASK

(71) Applicant: Samsung Display Co., Ltd., Yongin-si (KR)

(72) Inventors: Sanghoon Kim, Yongin-si (KR); Jongsung Park, Yongin-si (KR); Sangshin Lee, Yongin-si (KR); Seungjin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 625 days.

(21) Appl. No.: 18/175,438

(22) Filed: Feb. 27, 2023

(65) Prior Publication Data

US 2023/0374646 A1 Nov. 23, 2023

(30) Foreign Application Priority Data

May 17, 2022 (KR) ........................ 10-2022-0060449
Jun. 30, 2022 (KR) ........................ 10-2022-0080855

(51) Int. Cl.
*C23C 14/04* (2006.01)
*H10K 59/122* (2023.01)
*H10K 59/88* (2023.01)
*H10K 71/16* (2023.01)

(52) U.S. Cl.
CPC ......... *C23C 14/042* (2013.01); *H10K 59/122* (2023.02); *H10K 59/88* (2023.02); *H10K 71/166* (2023.02)

(58) Field of Classification Search
CPC ..... H10K 71/166; H10K 59/122; H10K 59/88
See application file for complete search history.

(56) References Cited

U.S. PATENT DOCUMENTS

| | | | |
|---|---|---|---|
| 9,997,708 B2 | 6/2018 | Kim et al. | |
| 10,541,380 B1 | 1/2020 | Sung et al. | |
| 11,171,317 B2 | 11/2021 | Oh et al. | |
| 2017/0179390 A1 | 6/2017 | Baek | |
| 2018/0198067 A1 | 7/2018 | Kim et al. | |
| 2019/0073976 A1* | 3/2019 | Yeh | ...................... H10D 86/441 |
| 2019/0319212 A1* | 10/2019 | Park | ...................... H10K 59/131 |
| 2020/0144530 A1* | 5/2020 | Kim | ...................... C23C 14/042 |
| 2020/0208259 A1* | 7/2020 | Shin | ...................... C23C 14/042 |
| 2020/0403180 A1 | 12/2020 | Seon et al. | |

(Continued)

FOREIGN PATENT DOCUMENTS

| | | |
|---|---|---|
| EP | 3623495 A1 | 3/2020 |
| EP | 4060745 A2 | 9/2022 |

(Continued)

*Primary Examiner* — Mary Ellen Bowman
(74) *Attorney, Agent, or Firm* — Womble Bond Dickinson (US) LLP

(57) ABSTRACT

In a mask for depositing an emission layer, the mask includes: a plurality of deposition areas corresponding to a plurality of display panels, wherein each of the plurality of deposition areas includes: a sensor area in which a plurality of grooves are arranged at regular intervals; and a main deposition area outside the sensor area to surround the sensor area, the main deposition area including a plurality of through-holes arranged at regular intervals to enable a deposition material to pass therethrough.

11 Claims, 13 Drawing Sheets

(56) References Cited

U.S. PATENT DOCUMENTS

| | | | |
|---|---|---|---|
| 2021/0355572 | A1 | 11/2021 | Li et al. |
| 2022/0271255 | A1 | 8/2022 | Choi et al. |
| 2024/0172485 | A1* | 5/2024 | Jang ..................... H10K 50/844 |

FOREIGN PATENT DOCUMENTS

| | | | |
|---|---|---|---|
| KR | 10-2017-0075113 | A | 7/2017 |
| KR | 10-2018-0083459 | A | 7/2018 |
| KR | 10-2019-0121690 | A | 10/2019 |
| KR | 10-2020-0013782 | A | 2/2020 |
| KR | 10-2020-0121958 | A | 10/2020 |
| KR | 10-2257213 | B1 | 5/2021 |
| KR | 10-2420460 | B1 | 7/2022 |

* cited by examiner

MASK FOR DEPOSITING EMISSION LAYER, METHOD OF MANUFACTURING THE MASK, AND DISPLAY APPARATUS MANUFACTURED USING THE MASK

CROSS-REFERENCE TO RELATED APPLICATIONS

The present application claims priority to and the benefit of Korean Patent Application Nos. 10-2022-0060449, filed on May 17, 2022, and 10-2022-0080855, filed on Jun. 30, 2022, in the Korean Intellectual Property Office, the entire disclosures of each of which are incorporated herein by reference.

BACKGROUND

1. Field

Aspects of one or more embodiments relate to a mask for depositing an emission layer, a method of manufacturing the mask, and a display apparatus manufactured using the mask.

2. Description of the Related Art

In general, a display apparatus includes a display area and a peripheral area outside the display area. In such a display apparatus, various functions may be added to the display apparatus, and the area occupied by the display area may be relatively increased. Accordingly, studies on a display apparatus in which various components may be arranged in a display area have been conducted.

The above information disclosed in this Background section is only for enhancement of understanding of the background and therefore the information discussed in this Background section does not necessarily constitute prior art.

SUMMARY

Aspects of one or more embodiments relate to a mask for depositing an emission layer, a method of manufacturing the mask, and a display apparatus manufactured using the mask, and for example, to a mask for depositing an emission layer, in which a defect rate in a display apparatus manufacturing process may be reduced, a method of manufacturing the mask, and a display apparatus manufactured using the mask.

In a display apparatus of some systems, the frequency of occurrence of a defect in a manufacturing process is high.

To address various problems including the above, one or more embodiments include a mask for depositing an emission layer, in which a defect rate in a display apparatus manufacturing process may be reduced, a method of manufacturing the mask, and a display apparatus manufactured using the mask. However, this is only an example, and the scope of one or more embodiments is not limited thereto.

Additional aspects will be set forth in part in the description which follows and, in part, will be apparent from the description, or may be learned by practice of the presented embodiments.

According to one or more embodiments, in a mask for depositing an emission layer, the mask includes a plurality of deposition areas corresponding to a plurality of display panels, wherein each of the plurality of deposition areas includes a sensor area in which a plurality of grooves are arranged at regular intervals, and a main deposition area positioned outside the sensor area to surround the sensor area, the main deposition area including a plurality of through-holes arranged at regular intervals such that a deposition material passes therethrough.

According to some embodiments, the plurality of grooves may be in a first surface, and the plurality of through-holes may pass through the first surface and a second surface, the second surface being opposite to the first surface.

According to some embodiments, a first area of each of the plurality of grooves in the first surface may be less than or equal to a second area of each of the plurality of through-holes in the first surface.

According to some embodiments, a third area of each of the plurality of through-holes in the second surface may be less than the second area.

According to some embodiments, a depth of each of the plurality of grooves may be greater than half of a thickness between the first surface and the second surface.

According to some embodiments, the first surface may be a surface in a direction to a deposition source, and the second surface may be a surface in a direction to an object on which an emission layer is to be deposited.

According to one or more embodiments, in a method of manufacturing a mask for depositing an emission layer, the method includes: simultaneously forming, in a first surface of a mask plate, a plurality of grooves in a sensor area, and a plurality of temporary grooves in a main deposition area positioned around the sensor area to surround the sensor area, and removing portions corresponding to the plurality of temporary grooves in a second surface of the mask plate opposite to the first surface such that the plurality of temporary grooves become a plurality of through-holes.

According to some embodiments, an area of each of the plurality of grooves in the first surface may be equal to an area of each of the plurality of temporary grooves in the first surface.

According to some embodiments, an area of each of the plurality of temporary grooves in the first surface may be greater than an area of each of the plurality of through-holes in the second surface.

According to some embodiments, the simultaneously forming may include simultaneously forming the plurality of grooves and the plurality of temporary grooves at a depth greater than half of a thickness between the first surface and the second surface.

According to one or more embodiments, a display apparatus includes a substrate including an opening, a display area, and an intermediate area, the display area being positioned outside the opening to surround the opening, and the intermediate area being between the opening and the display area, a plurality of display elements located over the display area, each of the plurality of display elements including a pixel electrode, an opposite electrode, and an emission layer between the pixel electrode and the opposite electrode, and a dummy emission layer arranged in the intermediate area to be apart from the emission layer, wherein an end of the dummy emission layer in a direction to the opening is not exposed by the opening.

According to some embodiments, the display apparatus may further include a first functional layer arranged over the display area and the intermediate area, positioned between the pixel electrode and the emission layer in the display area, and including a first through-hole corresponding to the opening.

According to some embodiments, an area of the first through-hole may be equal to an area of the opening.

According to some embodiments, an inner surface of the first through-hole and an inner surface of the opening may form a continuous surface.

According to some embodiments, the display apparatus may further include a second functional layer arranged over the display area and the intermediate area, positioned between the emission layer and the opposite electrode in the display area, and including a second through-hole corresponding to the opening.

According to some embodiments, an area of the second through-hole may be equal to an area of the opening.

According to some embodiments, an inner surface of the second through-hole and an inner surface of the opening may form a continuous surface.

According to some embodiments, the dummy emission layer may be provided as a plurality of dummy emission layers to be positioned around the opening.

According to some embodiments, the dummy emission layer may be provided as a plurality of dummy emission layers to be positioned around the opening, and an end of each of the dummy emission layers in the direction to the opening may not be exposed by the opening.

According to some embodiments, the display apparatus may further include pixel-defining layer integrally arranged as a single body over the display area and the intermediate area, and including a pixel opening that covers an edge of the pixel electrode and exposes the pixel electrode in the display area, wherein an entire lower surface of the dummy emission layer may be in contact with the pixel-defining layer.

These and/or other aspects will become apparent and more readily appreciated from the following description of the embodiments, the accompanying drawings, and claims.

BRIEF DESCRIPTION OF THE DRAWINGS

The above and other aspects, features, and characteristics of certain embodiments will be more apparent from the following description taken in conjunction with the accompanying drawings, in which.

DETAILED DESCRIPTION

Figure 1:
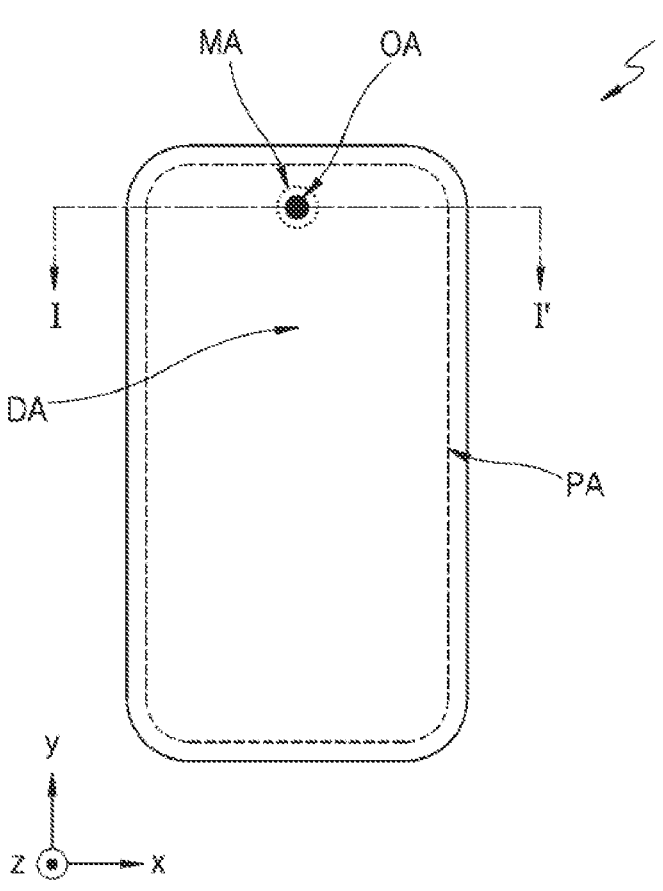
FIG. 1 is a schematic plan view of a display apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

As the disclosure allows for various changes and numerous embodiments, embodiments will be illustrated in the drawings and described in detail in the written description. Effects and features of the disclosure, and methods for achieving them will be clarified with reference to embodiments described below in detail with reference to the drawings. However, the disclosure is not limited to the following embodiments and may be embodied in various forms.

Hereinafter, the disclosure will be described in detail by explaining aspects of some embodiments of the disclosure with reference to the attached drawings. Like reference numerals in the drawings denote like elements.

It will be understood that when a layer, region, or element is referred to as being "formed on" another layer, area, or element, it can be directly or indirectly formed on the other layer, region, or element. That is, for example, intervening layers, regions, or elements may be present. Sizes of elements in the drawings may be exaggerated for convenience of explanation. For example, because sizes and thicknesses of elements in the drawings are arbitrarily illustrated for convenience of description, the disclosure is not limited thereto.

In the embodiments below, the x-axis, the y-axis and the z-axis are not limited to three axes of the rectangular coordinate system, and may be interpreted in a broader sense. For example, the x-axis, the y-axis, and the z-axis may be perpendicular to one another or may represent different directions that are not perpendicular to one another.

FIG. 1 is a schematic plan view of a display apparatus 1 according to some embodiments. The display apparatus 1 according to some embodiments may include an electronic apparatus, such as a smartphone, a mobile phone, a navigation apparatus, a game console, a television (TV), a vehicle head unit, a notebook computer, a laptop computer, a tablet computer, a personal media player (PMP), or a personal digital assistant (PDA). Furthermore, the display apparatus 1 according to some embodiments may include a center information display (CID) located over an instrument panel, a center fascia, or a dashboard of a vehicle, a room mirror display functioning in place of a side mirror of a vehicle, or an electronic apparatus located over the back of a front seat as an entertaining element for a rear seat of a vehicle. Also, the electronic apparatus may include a flexible apparatus. FIG. 1 illustrates a case in which the display apparatus 1 according to some embodiments is a smartphone as an example.

The display apparatus 1 may include a display area DA and a peripheral area PA outside the display area DA. When the display area DA is viewed on a plane, the display area DA may have a substantially rectangular shape as shown in FIG. 1. However, embodiments according to the present disclosure are not limited thereto, and the display area DA may have a polygonal shape, such as a triangle, a pentagon, or a hexagon, a circular shape, an oval shape, or an irregular shape. Corners of the display area DA may have a round shape. The peripheral area PA may be a type of a non-display area in which display elements are not arranged. The display area DA may be entirely surrounded by the peripheral area PA.

Pixels including various display elements, such as organic light-emitting diodes (OLEDs), may be arranged in the display area DA. The pixels may be arranged in various forms, such as a stripe arrangement, a pentile arrangement, or a mosaic arrangement, in an x-axis direction and a y-axis direction to display an image.

An opening area OA may be positioned in the display area DA. The opening area OA may be defined by an opening of a substrate 100 (see FIGS. 3 and 6) included in the display apparatus 1. As shown in FIG. 1, the opening area OA is positioned at the upper center of the display area DA and may have a shape in which the display area DA positioned outside the opening area OA surrounds the opening area OA. The opening area OA may be positioned in the display area DA in various manners. For example, the opening area OA may be positioned at the upper left side of the display area DA or at the upper right side of the display area DA. Although FIG. 1 illustrates that one opening area OA is positioned in the display area DA, the display apparatus 1 may include a plurality of opening areas OA.

An intermediate area MA may be between the display area DA and the opening area OA. The intermediate area MA may have a closed loop shape entirely surrounding the opening area OA in a plan view.

Figure 2:
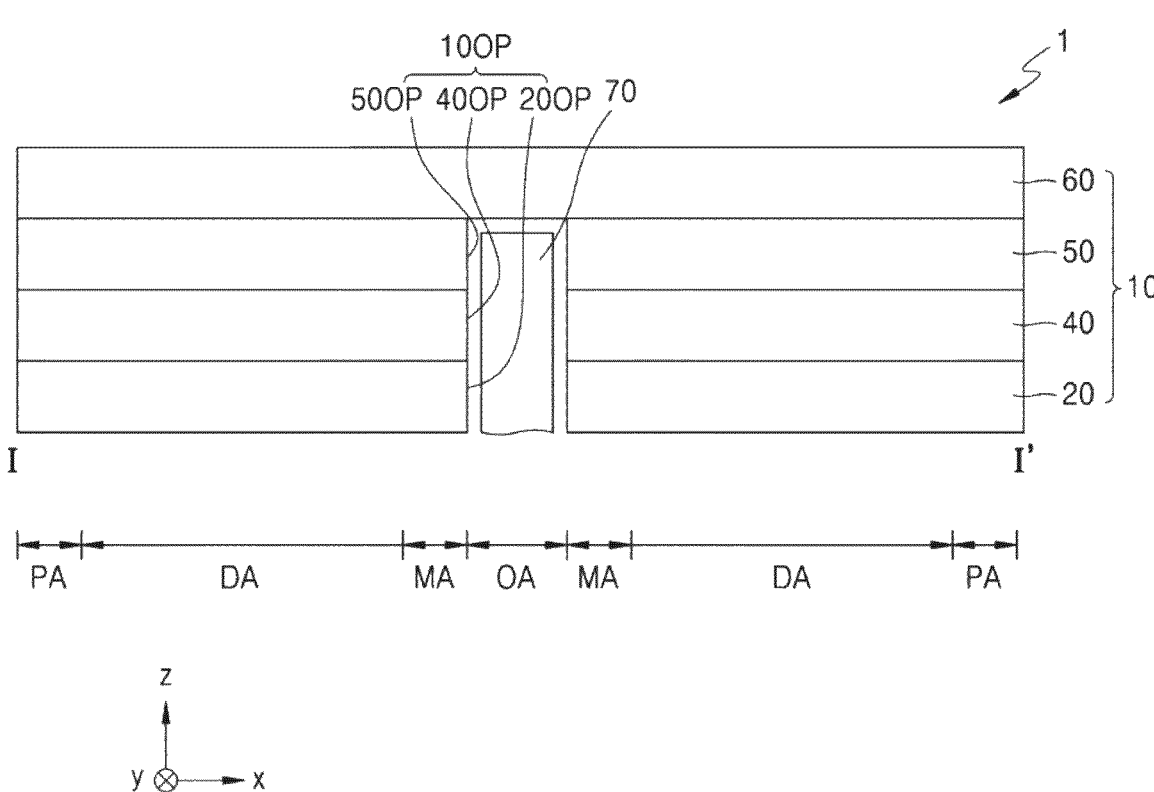
FIG. 2 is a schematic cross-sectional view of a cross-section of the display apparatus of FIG. 1 taken along a line I-I'.

FIG. 2 is a schematic cross-sectional view of a cross-section of the display apparatus 1 of FIG. 1 taken along a line I-I'. As described above, the display apparatus 1 may include a display panel 10 and a component 70 arranged in the opening area OA of the display panel 10. The display panel 10 and the component 70 may be accommodated in a housing.

The display panel 10 may include an image generation layer 20, an input sensing layer 40, an optical functional layer 50, and a cover window 60.

The image generation layer 20 may include display elements (or light-emitting elements) that emit light to display an image. A display element may include a light-emitting diode, e.g., an OLED including an organic emission layer. The display element may also include an inorganic light-emitting diode including an inorganic material. The inorganic light-emitting diode may include a PN junction diode including inorganic semiconductor-based materials. When a voltage is applied to a PN junction diode in a forward direction, holes and electrons are injected, and energy generated by recombination of the holes and the electrons is converted into light energy such that a certain color of light may be emitted. The aforementioned inorganic light-emitting diode may have a width of several to several hundred micrometers, or several to several hundred nanometers.

However, embodiments according to the present disclosure are not limited thereto. For example, the image generation layer 20 may include a quantum dot layer. That is, light having a wavelength of a particular wavelength band generated from an emission layer included in the image generation layer 20 may also be converted into light having a wavelength previously set by the quantum dot layer.

The input sensing layer 40 may obtain coordinate information according to an external input, e.g., a touch event. The input sensing layer 40 may include a sensing electrode (or a touch electrode) and trace lines electrically connected to the sensing electrode. The input sensing layer 40 may sense an external input by using a mutual capacitive method and/or a self-capacitive method.

The input sensing layer 40 may be located on the image generation layer 20. The input sensing layer 40 may be directly formed over the image generation layer 20 or may be separately formed and then attached to the image generation layer 20 through an adhesive layer, such as an optically clear adhesive (OCA). In the former case, the input sensing layer 40 may be continuously formed after a process of forming the image generation layer 20, in which case the adhesive layer may not be between the input sensing layer 40 and the image generation layer 20. For reference, although FIG. 2 illustrates that the input sensing layer 40 is between the image generation layer 20 and the optical functional layer 50, various modifications may be made. For example, the input sensing layer 40 may be positioned over the optical functional layer 50.

The optical functional layer 50 may include an anti-reflective layer. The anti-reflective layer may reduce reflectance of light (external light) incident from the outside toward the display panel 10 through the cover window 60. The anti-reflective layer may include a retardation film and a polarization film. Alternatively, the anti-reflective layer may include a black matrix and color filters. In the latter case, the color filters may be arranged considering the color of light emitted from the image generation layer 20.

The display panel 10 may include an opening 10OP to improve transmittance of the opening area OA. The opening 10OP may include a first opening 20OP passing through the image generation layer 20, a second opening 40OP passing through the input sensing layer 40, and a third opening 50OP passing through the optical functional layer 50. That is, the first opening 20OP passing through the image generation layer 20, the second opening 40OP passing through the input sensing layer 40, and the third opening 50OP passing through the optical functional layer 50 may overlap each other to form the opening 10OP of the display panel 10.

The cover window 60 may be located on the optical functional layer 50. The cover window 60 may be attached to the optical functional layer 50 through an adhesive layer, such as an OCA. The cover window 60 may cover the first opening 20OP passing through the image generation layer 20, the second opening 40OP passing through the input sensing layer 40, and the third opening 50OP passing through the optical functional layer 50. The cover window 60 may include glass or plastic. When the cover window 60 includes glass, the cover window 60 may include ultra-thin glass. When the cover window 60 includes plastic, the cover window 60 may include polyethersulfone, polyacrylate, polyetherimide, polyethylene naphthalate, polyethylene terephthalate, polyphenylene sulfide, polyarylate, polyimide, polycarbonate, or cellulose acetate propionate.

The opening area OA may be a type of component area (e.g., a sensor area, a camera area, or a speaker area) in which the component 70 for adding various functions to the display apparatus 1 is positioned.

The component 70, which is an electronic element, may be arranged (in a −z direction) to correspond to the opening area OA. The component 70 may be a camera or sensor, which is an electronic element using light or sound. In this case, sensors may include a proximity sensor that measures distance or an illumination sensor that measures brightness. The electronic element using light may use light in various wavelength bands, such as visible light, infrared light, or ultraviolet light. The opening area OA may allow light and/or sound to be output from the component 70 to the outside or light and/or sound from the outside to travel toward the component 70.

Figure 3:
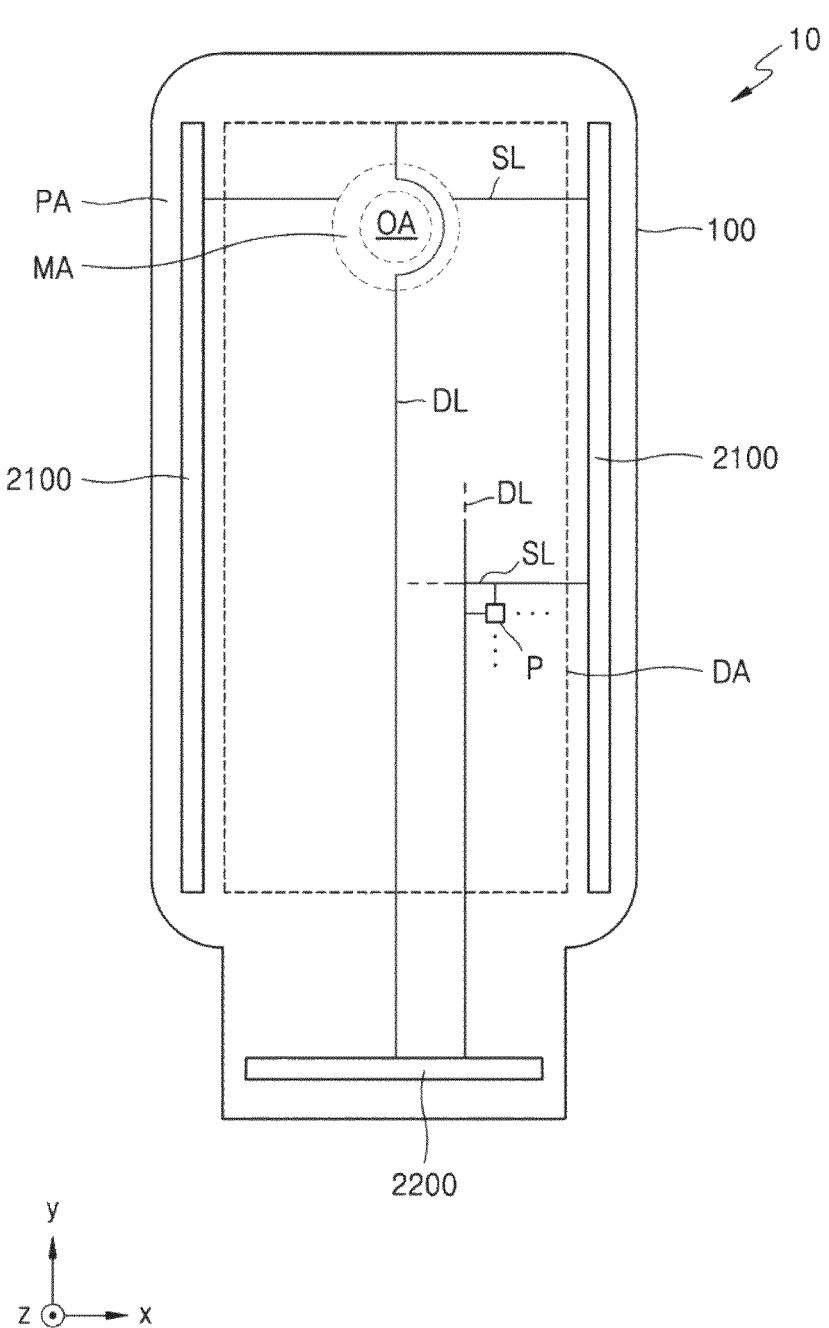
FIG. 3 is a schematic plan view of a display panel included in the display apparatus of FIG. 1.

FIG. 3 is a schematic plan view of the display panel 10 included in the display apparatus 1 of FIG. 1.

As shown in FIG. 3 and as described above, the display panel 10 may include the opening area OA, the display area DA, the intermediate area MA, and the peripheral area PA. For example, the substrate 100 of the display panel 10 may be regarded to include an opening corresponding to the opening area OA, the display area DA positioned outside the opening to surround the opening, the intermediate area MA between the opening and the display area DA, and the peripheral area PA positioned outside the display area DA.

The display panel 10 may include a plurality of pixels P arranged in the display area DA, and the display panel 10 may display an image by using light emitted from the pixels P. Each of the pixels P may emit red, green, or blue light by using a light-emitting diode. The pixels P may be electrically connected to a scan line SL and a data line DL.

In the peripheral area PA, a scan driver 2100 that provides a scan signal to each pixel P, a data driver 2200 that provides a data signal to each pixel P, a first main power line for providing a driving voltage to each pixel P, and a second main power line for providing a common voltage to each pixel P may be arranged. The display panel 10 includes two scan drivers 2100, and the scan drivers 2100 may be arranged on both sides (in a +x direction and a −x direction) with the display area DA therebetween. In this case, a pixel P arranged on the left side (in the −x direction) of the opening area OA may be electrically connected to the scan driver 2100 arranged on the left side, and a pixel P arranged on the right side (in the +x direction) of the opening area OA may be electrically connected to the scan driver 2100 arranged on the right side.

The intermediate area MA may surround the opening area OA. The intermediate area MA is an area in which a display element, such as a light-emitting diode emitting light, is not arranged. Some of signal lines that provide signals to pixels P among the pixels P in the display area DA positioned relatively adjacent to the opening area OA may pass through the intermediate area MA.

For example, while the data line DL crosses the display area DA, a portion of the data line DL may bypass the intermediate area MA along an edge of the opening 10OP (see FIGS. 5 and 6) of the display panel 10 formed in the opening area OA. FIG. 3 illustrates that, while data lines DL cross the display area DA in a y-axis direction, a portion of the data line DL bypasses the intermediate area MA to partially surround the opening area OA.

Scan lines SL cross the display area DA in an x-axis direction, and may each include a first portion and a second portion spaced apart from each other with the opening area OA therebetween. In this case, a first portion of the scan line SL positioned on one side (in the −x direction) of the opening area OA may be electrically connected to the scan driver 2100 positioned on one side (in the −x direction) of the opening area OA, and a second portion of the scan line SL positioned on the other side (in the +x direction) of the opening area OA may be electrically connected to the scan driver 2100 positioned on the other side (in the +x direction) of the opening area OA. Accordingly, the scan lines SL may not need to bypass the intermediate area MA to partially surround the opening area OA. When the display panel 10 includes only one scan driver 2100, some scan lines SL may also bypass the intermediate area MA to partially surround the opening area OA.

For reference, although FIG. 3 illustrates that the data driver 2200 is located over the substrate 100 to be adjacent to one edge (in a −y direction) of the substrate 100, embodiments according to the present disclosure are not limited thereto. For example, the data driver 2200 may also be located over a printed circuit board electrically connected to the display panel 10 through pads positioned at one edge of the display panel 10. In addition, as shown in FIG. 3, when the data driver 2200 is located over the substrate 100 to be adjacent to one edge (in the −y direction) of the substrate 100, a portion of the substrate 100 is bent, and accordingly, a portion of the substrate 100 on which the data driver 2200 or the like is positioned may overlap the display area DA and may be positioned behind the display area DA.

Figure 4:
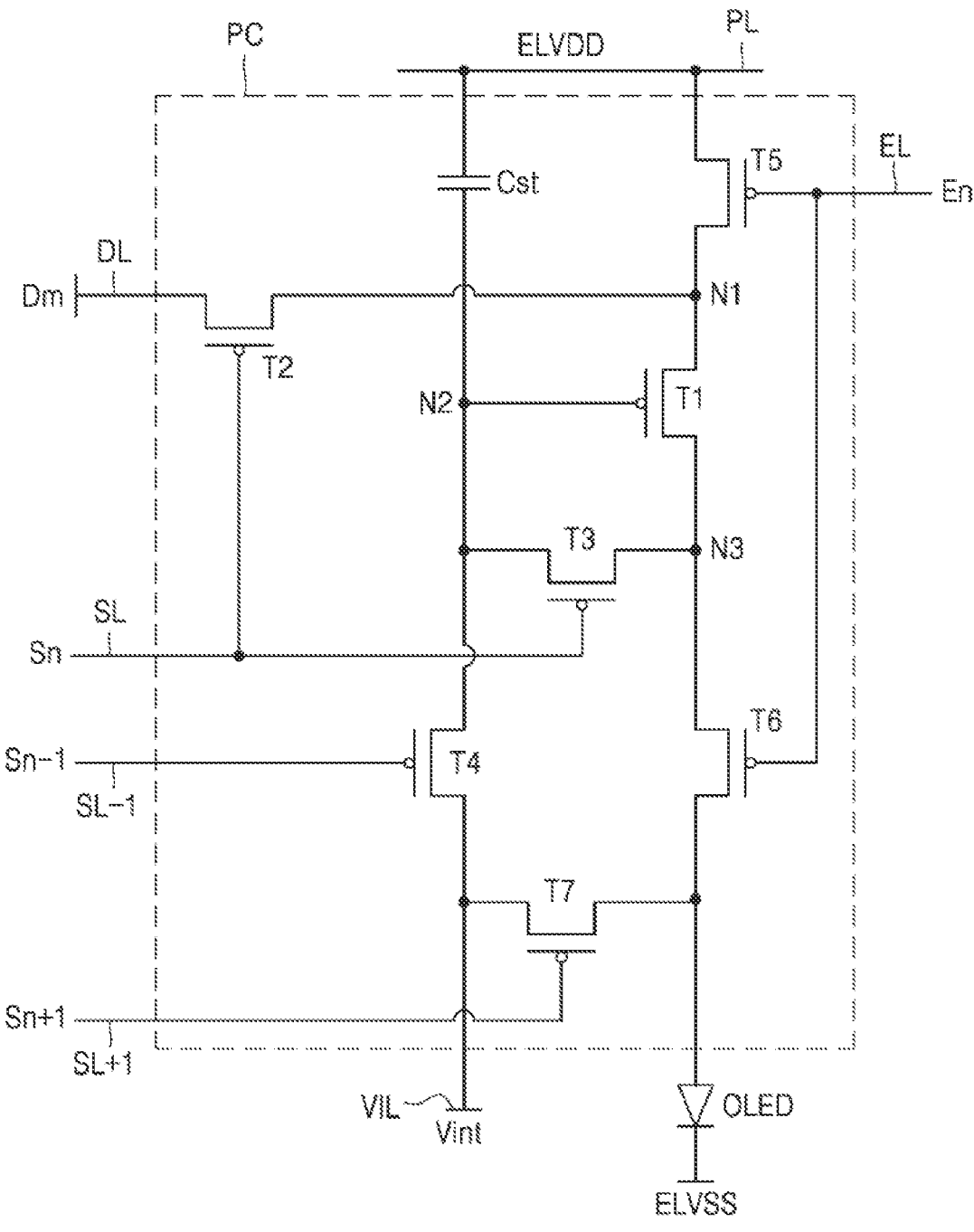
FIG. 4 is an equivalent circuit diagram of a pixel circuit electrically connected to a light-emitting diode included in the display panel of FIG. 3.

FIG. 4 is an equivalent circuit diagram of a pixel circuit PC electrically connected to a light-emitting diode LED (as an example, an OLED is illustrated in FIG. 4) included in the display panel 10 of FIG. 3. As shown in FIG. 4, the pixel circuit PC including a plurality of thin-film transistors and a capacitor may be electrically connected to the organic light-emitting diode OLED. FIG. 4 illustrates that the pixel circuit PC includes seven thin-film transistors T1 to T7 and a storage capacitor Cst. However, embodiments according to the present disclosure are not limited thereto, and the number and connection relationships thereof may be variously modified.

The plurality of thin-film transistors T1 to T7 and the storage capacitor Cst may be connected to signal lines SL, SL−1, SL+1, EL, and DL, an initialization voltage line VL, and a driving voltage line PL. At least one of the lines, (e.g., the driving voltage line PL), may be shared by neighboring pixels P.

The plurality of thin-film transistors T1 to T7 may include a driving transistor T1, a switching transistor T2, a compensation transistor T3, a first initialization transistor T4, an operation control transistor T5, an emission control transistor T6, and a second initialization transistor T7.

The light-emitting diode LED, such as an OLED, may include a pixel electrode and an opposite electrode, the pixel electrode of the organic light-emitting diode OLED may receive supply of a driving current by being connected to the driving transistor T1 via the emission control transistor T6, and the opposite electrode may receive supply of a second power voltage ELVSS. The organic light-emitting diode OLED may generate light having a luminance corresponding to the driving current.

Although FIG. 4 illustrates that all of the plurality of thin-film transistors T1 to T7 are p-channel metal-oxide-semiconductor field-effect transistors (MOSFETs) (PMOSs), embodiments according to the present disclosure are not limited thereto. For example, all of the plurality of thin-film transistors T1 to T7 may be n-channel MOSFETs (NMOSs). Alternatively, some of the plurality of thin-film transistors T1 to T7 may be PMOSs, whereas the others may be NMOSs. The plurality of thin-film transistors T1 to T7 may include amorphous silicon or polysilicon. Alternatively, at least some of the thin-film transistors T1 to T7 may include an oxide semiconductor.

The signal lines may include a scan line SL that transmits a scan signal Sn to the switching transistor T2 and the compensation transistor T3, a previous scan line SL−1 that transmits a previous scan signal Sn−1 to the first initialization transistor T4, a next scan line SL+1 that transmits a next scan signal Sn+1 to the second initialization transistor T7, an emission control line EL that transmits an emission control signal En to the operation control transistor T5 and the emission control transistor T6, and a data line DL that crosses the scan line SL and transmits a data signal Dm.

The driving voltage line PL may transmit a driving voltage ELVDD to the driving transistor T1, and the initialization voltage line VL may transmit an initialization voltage Vint that initializes the driving transistor T1 and initializes the pixel electrode of the organic light-emitting diode OLED.

A driving gate electrode of the driving transistor T1 may be connected to a first capacitor electrode of the storage capacitor Cst (through a node N2), one of a source region and a drain region of the driving transistor T1 may be connected to the driving voltage line PL via the operation control transistor T5 (which connects with the driving transistor T1 through a node N1), and the other of the source region and the drain region of the driving transistor T1 may be electrically connected to the pixel electrode of the organic light-emitting diode OLED via the emission control transistor T6 (which connects with the driving transistor T1 through a node N3). The driving transistor T1 may supply the driving current to the organic light-emitting diode OLED by receiving the data signal Dm in response to a switching operation of the switching transistor T2. That is, the driving transistor T1 may control an amount of current flowing through an organic light-emitting diode OLED in response to a voltage changed by the data signal Dm.

A switching gate electrode of the switching transistor T2 may be connected to the scan line SL that transmits the scan signal Sn, one of a source region and a drain region of the switching transistor T2 may be connected to the data line DL, and the other of the source region and the drain region of the switching transistor T2 may be connected to the driving transistor T1 and then may be connected to the driving voltage line PL via the operation control transistor T5. The switching transistor T2 may transmit the data signal Dm from the data line DL to the driving transistor T1, in response to a voltage applied to the scan line SL. That is, the switching transistor T2 may be turned on in response to the scan signal Sn received through the scan line SL and may perform a switching operation of transmitting the data signal Dm, which is transmitted through the data line DL, to the driving transistor T1.

A compensation gate electrode of the compensation transistor T3 is connected to the scan line SL. One of a source region and a drain region of the compensation transistor T3 may be connected to the pixel electrode of the organic light-emitting diode OLED via the emission control transistor T6. The other of the source region and the drain region of the compensation transistor T3 may be connected to the first capacitor electrode of the storage capacitor Cst and the driving gate electrode of the driving transistor T1. The compensation transistor T3 may be turned on in response to the scan signal Sn received through the scan line SL and may cause the driving transistor T1 to be diode-connected thereto.

A first initialization gate electrode of the first initialization transistor T4 may be connected to the previous scan line SL−1. One of a source region and a drain region of the first initialization transistor T4 may be connected to the initialization voltage line VL. The other of the source region and the drain region of the first initialization transistor T4 may be connected to the first capacitor electrode of the storage capacitor Cst and the driving gate electrode of the driving transistor T1. That is, the first initialization transistor T4 may be turned on in response to the previous scan signal Sn−1 received through the previous scan line SL−1 and may perform an initialization operation of initializing a voltage of the driving gate electrode of the driving transistor T1 by transmitting the initialization voltage Vint to the driving gate electrode of the driving transistor T1.

An operation control gate electrode of the operation control transistor T5 may be connected to the emission control line EL, one of a source region and a drain region of the operation control transistor T5 may be connected to the driving voltage line PL, and the other may be connected to the driving transistor T1 and the switching transistor T2.

An emission control gate electrode of the emission control transistor T6 may be connected to the emission control line EL, one of a source region and a drain region of the emission control transistor T6 may be connected to the driving transistor T1 and the compensation transistor T3, and the other of the source region and the drain region of the emission control transistor T6 may be electrically connected to the pixel electrode of the organic light-emitting diode OLED.

The operation control transistor T5 and the emission control transistor T6 are simultaneously turned on in response to the emission control signal En received through the emission control line EL and cause the driving voltage ELVDD to be transmitted to the organic light-emitting diode OLED through the driving transistor T1, such that the driving current flows through the organic light-emitting diode OLED.

A second initialization gate electrode of the second initialization transistor T7 may be connected to the next scan line SL+1, one of a source region and a drain region of the second initialization transistor T7 may be connected to the pixel electrode of the organic light-emitting diode OLED, and the other of the source region and the drain region of the second initialization transistor T7 may be connected to the initialization voltage line VL to receive supply of the initialization voltage Vint. The second initialization transistor T7 is turned on in response to the next scan signal Sn+1 received through the next scan line SL+1 and initializes the pixel electrode of the organic light-emitting diode OLED. For reference, the next scan line SL+1 may be a scan line SL of a pixel that is adjacent to the pixel P shown in FIG. 4 and electrically connected to the data line DL. That is, the scan line SL may transmit the same electrical signal with a time difference and function as a scan line SL of one pixel or function as a next scan line SL+1 of an adjacent pixel.

The storage capacitor Cst may include the first capacitor electrode and a second capacitor electrode. The first capacitor electrode of the storage capacitor Cst is connected to the driving gate electrode of the driving transistor T1, and the second capacitor electrode of the storage capacitor Cst is connected to the driving voltage line PL. The storage capacitor Cst may store an electric charge corresponding to a difference between the voltage of the driving gate electrode of the driving transistor T1 and the driving voltage ELVDD.

Detailed operations of each pixel P according to some embodiments are described in more detail below.

During an initialization period, when the previous scan signal Sn−1 is supplied through the previous scan line SL−1, the first initialization transistor T4 is turned on, and the driving transistor T1 is initialized by the initialization voltage Vint supplied from the initialization voltage line VIL.

During a data programming period, when the scan signal Sn is supplied through the scan line SL, the switching transistor T2 and the compensation transistor T3 are turned on. In this case, the driving transistor T1 is diode-connected by the compensation transistor T3 that is turned on, and biased in a forward direction. Then, a compensation voltage (Dm+Vth, Vth has a negative value) that is obtained by subtracting a threshold voltage (Vth) of the driving transistor T1 from the data signal Dm supplied from the data line DL is applied to the driving gate electrode of the driving transistor T1. The driving voltage ELVDD and the compensation voltage (Dm+Vth) are applied to opposite ends of the storage capacitor Cst, and the storage capacitor Cst stores an electric charge corresponding to a difference between voltages at opposite ends thereof.

During an emission period, the operation control transistor T5 and the emission control transistor T6 are turned on in response to the emission control signal En supplied from the emission control line EL. The driving current is generated according to the difference between the voltage of the driving gate electrode of the driving transistor T1 and the driving voltage ELVDD, and the driving current is supplied to the organic light-emitting diode OLED through the emission control transistor T6.

Figure 5:
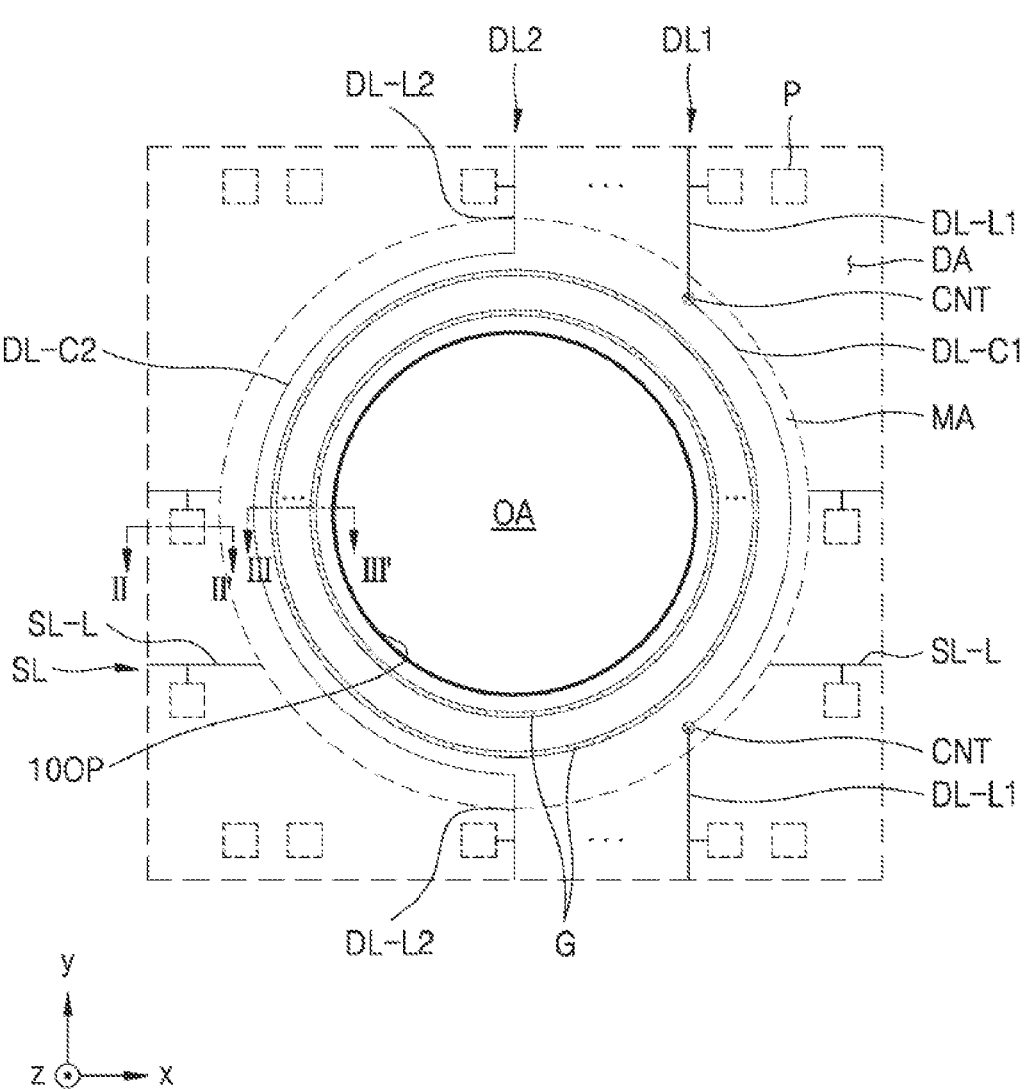
FIG. 5 is a schematic plan view of an area of the display panel of FIG. 3.

FIG. 5 is a schematic plan view of an area of the display panel 10 of FIG. 3. As shown in FIG. 5, the pixels P are arranged in the display area DA. The intermediate area MA may be between the opening area OA and the display area DA. In a plan view, pixels P adjacent to the opening area OA may be spaced apart from each other with respect to the opening area OA. That is, the pixels P may be spaced apart in the vertical direction (y-axis direction) with respect to the opening area OA, or may be spaced apart from each other in the left and right directions (x-axis direction) with respect to the opening area OA.

Among signal lines that supply signals to pixel circuits connected to light-emitting diodes of respective pixels P, signal lines adjacent to the opening area OA may bypass the opening area OA and/or the opening 10OP. Some of data lines DL passing through the display area DA are positioned in the same column, extend (in the y-axis direction) to provide data signals to pixels P positioned on one side (in a +y direction) of the opening area OA and pixels P positioned on the other side (in the −y direction) of the opening area OA, and may bypass the opening area OA and/or the opening 10OP along edges of the opening area OA and/or the opening 10OP in the intermediate area MA.

FIG. 5 illustrates that a first data line DL1 includes a first extension portion DL-L1 electrically connected to the pixels P positioned on one side (in the +y direction) of the opening area OA, a first extension portion DL-L1 electrically connected to the pixels P positioned on the other side (in the −y direction) of the opening area OA, and a first bypass portion DL-C1 bypassing the opening area OA and/or the opening 10OP along the edges of the opening area OA and/or the opening 10OP in the intermediate area MA. The first bypass portion DL-C1 may electrically connect the two first extension portions DL-L1 spaced apart from each other. As shown in FIG. 5, the first bypass portion DL-C1 may be substantially positioned on one side (in a +x direction) of the opening area OA. The first bypass portion DL-C1 may be positioned on a different layer from a layer on which the first extension portions DL-L1 are positioned, in which case, as shown in FIG. 5, the first bypass portion DL-C1 may be connected to the first extension portions DL-L1 through contact holes CNT. Unlike this, the first bypass portion DL-C1 and the first extension portions DL-L1 may also be integrally formed.

In addition, FIG. 5 illustrates that a second data line DL2 includes a second extension portion DL-L2 electrically connected to the pixels P positioned on one side (in the +y direction) of the opening area OA, a second extension portion DL-L2 electrically connected to the pixels P positioned on the other side (in the −y direction) of the opening area OA, and a second bypass portion DL-C2 bypassing the opening area OA and/or the opening 10OP along the edges of the opening area OA and/or the opening 10OP in the intermediate area MA. The second bypass portion DL-C2 may electrically connect the two second extension portions DL-L2 spaced apart from each other. As shown in FIG. 5, the second bypass portion DL-C2 may be substantially positioned on one side (in the +x direction) of the opening area OA. As shown in FIG. 5, the second bypass portion DL-C2 and the second extension portions DL-L2 may also be integrally formed. Unlike this, the second bypass portion DL-C2 may be positioned on a different layer from a layer on which the second extension portions DL-L2 are positioned, in which case the second bypass portion DL-C2 may be connected to the second extension portions DL-L2 through contact holes.

The scan line SL may be separated or disconnected with respect to the opening area OA. FIG. 5 illustrates that the scan line SL includes two sub-scan lines SL-L separated with respect to the opening area OA. A sub-scan line SL-L arranged on the left side (in a −x direction) of the opening area OA may receive a signal from the scan driver 2100 (see FIG. 3) arranged on the left side (in the −x direction) of the display area DA, and a sub-scan line SL-L arranged on the right side (in the +x direction) of the opening area OA may receive a signal from the scan driver 2100 (see FIG. 3) arranged on the right side (in the +x direction) of the display area DA.

Grooves G may be positioned in the intermediate area MA. The grooves G may be between the opening area OA and an area where the data lines DL bypass. That is, the grooves G may be between the first bypass portion DL-C1 and the opening area OA and between the second bypass portion DL-C2 and the opening area OA. In a plan view viewed from a direction (z-axis direction) substantially perpendicular to a substrate, each of the grooves G may have a closed loop shape surrounding the opening area OA. The grooves G may be spaced apart from each other.

Figure 6:
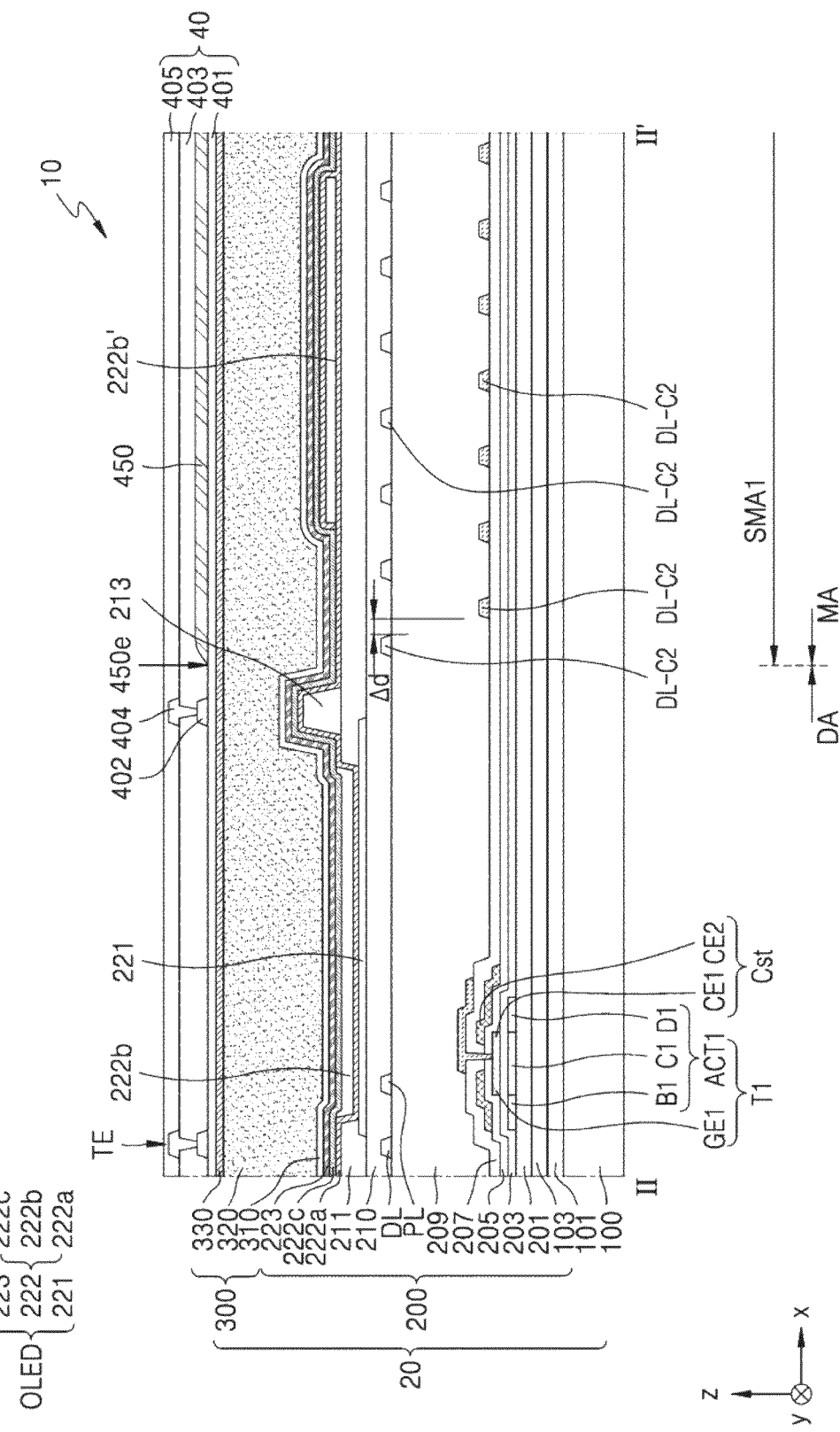
FIG. 6 is a schematic cross-sectional view of a cross-section of the display panel of FIG. 5 taken along a line II-II'.

FIG. 6 is a schematic cross-sectional view of a cross-section of the display panel 10 of FIG. 5 taken along a line II-II'.

The display panel 10 includes the substrate 100. The substrate 100 may include glass, a metal, or a polymer resin. When the substrate 100 is flexible or bendable, the substrate 100 may include a polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. Various modifications may be made. For example, the substrate 100 may have a multi-layer structure including two layers each including a polymer resin and a barrier layer including an inorganic material (e.g., silicon oxide, silicon nitride, or silicon oxynitride) and positioned between the two layers.

The image generation layer 20 may include an element layer 200 and an encapsulation layer 300. Thin-film transistors and a capacitor included in the pixel circuit PC as described above with reference to FIG. 4 are located over the substrate 100, and an organic light-emitting diode OLED, which is a display element, may be located over the thin-film transistors. A first barrier layer 101, a second barrier layer 103, and a buffer layer 201 may be located over the substrate 100. Such layers may prevent or reduce instances of impurities or contaminants penetrating into a thin-film transistor. Each of the first barrier layer 101, the second barrier layer 103, and the buffer layer 201 may include an inorganic insulating material, such as silicon nitride, silicon oxynitride or silicon oxide, and may have a single-layer structure or a multi-layer structure. For reference, a bottom metal layer may be between the first barrier layer 101 and the second barrier layer 103. The bottom metal layer may block light emitted from the component 70 (see FIG. 2) or external light from reaching a thin-film transistor of the pixel circuit PC.

As described above with reference to FIG. 4, the pixel circuit PC may include a plurality of thin-film transistors and a capacitor. FIG. 6 illustrates the driving transistor T1 and the storage capacitor Cst as an example.

The driving transistor T1 may include a semiconductor layer ACT1 over the buffer layer 201 and a gate electrode GE1 overlapping a channel region C1 of the semiconductor layer ACT1. The semiconductor layer ACT1 may include a silicon-based semiconductor material, e.g., polysilicon. The semiconductor layer ACT1 may include the channel region C1, and a first region B1 and a second region D1 arranged on both sides of the channel region C1. The first region B1 and the second region D1 are regions including a higher concentration of impurities than the channel region C1. One of the first region B1 and the second region D1 may correspond to a source region, and the other may correspond to a drain region.

A gate insulating layer 203 may be between the semiconductor layer ACT1 and the gate electrode GE1. The gate insulating layer 203 may include an inorganic insulating material, such as silicon oxide, silicon nitride, or silicon oxynitride, and may have a single-layer structure or a multi-layer structure.

The gate electrode GE1 may include a conductive material including molybdenum (Mo), aluminum (Al), copper (Cu), or titanium (Ti), and may have a single-layer structure or a multi-layer structure. For example, the gate electrode GE1 may have a multi-layer structure including Mo/Al/Mo or Mo/Al.

The storage capacitor Cst may include a lower electrode CE1 (or the first capacitor electrode) and an upper electrode CE2 (or the second capacitor electrode) overlapping each other. The lower electrode CE1 of the storage capacitor Cst may be integrally formed with the gate electrode GE1. A first interlayer insulating layer 205 may be between the lower electrode CE1 and the upper electrode CE2 of the storage capacitor Cst. The first interlayer insulating layer 205 may include an inorganic insulating material, such as silicon oxide, silicon nitride, or silicon oxynitride, and may have a single-layer structure or a multi-layer structure. The upper electrode CE2 of the storage capacitor Cst may include a conductive material including Mo, Al, Cu, or Ti, and may have a single-layer structure or a multi-layer structure. For example, the upper electrode CE2 may have a multi-layer structure including Mo/Al/Mo or Mo/Al.

A second interlayer insulating layer 207 may be located over the storage capacitor Cst. The second interlayer insulating layer 207 may include an inorganic insulating material, such as silicon oxide, silicon nitride, or silicon oxynitride, and may have a single-layer structure or a multi-layer structure.

Among the thin-film transistors described with reference to FIG. 4, transistors other than the driving transistor T1 may have an identical or similar structure as the driving transistor T1 shown in FIG. 6. For reference, semiconductor layers of at least some of the thin-film transistors may be integrally formed with each other. For example, the source region of the driving transistor T1 and the drain region of the operation control transistor T5 may be integrally formed, and the drain region of the driving transistor T1 and the source region of the emission control transistor T6 may be integrally formed.

A first electrode layer may be located over the second interlayer insulating layer 207. The first electrode layer may include connection electrodes for electrically connecting components of the pixel circuit PC to the organic light-emitting diode OLED. The first electrode layer may include Al, Cu, or Ti, and may have a single-layer structure or a multi-layer structure. For example, the first electrode layer may have a multi-layer structure including Ti/Al/Ti.

A third interlayer insulating layer 209 may be located over the first electrode layer. The third interlayer insulating layer 209 may include an organic insulating material. For example, the third interlayer insulating layer 209 may include acryl, benzocyclobutene (BCB), polyimide, or hexamethyldisiloxane (HMDSO).

A second electrode layer including the data line DL and the driving voltage line PL may be located over the third interlayer insulating layer 209. The second electrode layer may include Al, Cu, or Ti, and may have a single-layer structure or a multi-layer structure. For example, the second electrode layer may have a multi-layer structure including Ti/Al/Ti.

A planarization layer 210 may cover the second electrode layer and may have a substantially flat top surface. The planarization layer 210 may include an organic insulating material, such as acryl, BCB, polyimide, or HMDSO.

For reference, although FIG. 6 illustrates that the second electrode layer located over the third interlayer insulating layer 209 includes the data line DL and the driving voltage line PL, embodiments according to the present disclosure are not limited thereto. For example, one of the data line DL and the driving voltage line PL may also be included in the first electrode layer located over the second interlayer insulating layer 207.

The organic light-emitting diode OLED, which is a display element, may be located over the planarization layer 210. The organic light-emitting diode OLED may include a pixel electrode 221, an intermediate layer 222, and an opposite electrode 223.

The pixel electrode 221 located on the planarization layer 210 may be electrically connected to a thin-film transistor positioned therebelow through a contact hole formed in the planarization layer 210. For this, the pixel electrode 221 may be connected to a connection electrode located over the third interlayer insulating layer 209 or a connection electrode located over the second interlayer insulating layer 207 through a contact hole, and the connection electrode may be electrically connected to one of the source region and the drain region of the emission control transistor T6 through a contact hole. Each of pixel electrodes 221 may include a light transmissive conductive layer and a reflective layer, the light transmissive conductive layer including a light transmissive conductive oxide, such as indium tin oxide (ITO), indium oxide ($In_2O_3$), or indium zinc oxide (IZO), and the reflective layer including a metal, such as Al or silver (Ag). For example, each of the pixel electrodes 221 may have a three-layer structure including ITO/Ag/ITO.

A pixel-defining layer 211 located on the planarization layer 210 has an opening through which at least a central portion of each of the pixel electrodes 221 is exposed, and thus defines a pixel. The pixel-defining layer 211 increases a distance between an edge of each of the pixel electrodes 221 and the opposite electrode 223 and thus may prevent or reduce instances of an arc or the like occurring on edges of the pixel electrodes 221.

The pixel-defining layer 211 may include, e.g., an organic material, such as polyimide or HMDSO. Also, the pixel-defining layer 211 may include a light-shielding insulating material. Accordingly, the pixel-defining layer 211 is a colored, opaque, light-shielding insulating layer and may appear, e.g., black. For example, the pixel-defining layer 211 may include a polyimide-based binder and a pigment in which red, green, and blue are mixed. Alternatively, the pixel-defining layer 211 may include a binder and a mixture of a lactam black pigment and a blue pigment. Alternatively, the pixel-defining layer 211 may include carbon black. The pixel-defining layer 211 may improve contrast of the display apparatus.

The opposite electrode 223 may be located over the pixel electrode 221. The opposite electrode 223 may be integrally formed to correspond to the plurality of pixel electrodes 221. The opposite electrode 223 may include a light transmissive conductive layer and a semi-transmissive layer, the light transmissive conductive layer including ITO, $In_2O_3$, or IZO, and the semi-transmissive layer including a metal, such as Al or Ag. For example, the opposite electrode 223 may include a semi-transmissive layer including magnesium silver (MgAg).

The intermediate layer 222 between the pixel electrode 221 and the opposite electrode 223 includes an emission layer 222b. The intermediate layer 222 may include a first functional layer 222a between the pixel electrode 221 and the emission layer 222b, and a second functional layer 222c between the emission layer 222b and the opposite electrode 223. The emission layer 222b may include a polymer organic material or a low molecular weight organic material emitting a certain color of light. The first functional layer 222a may include a hole injection layer (HIL) and/or a hole transport layer (HTL), and the second functional layer 222c may include an electron transport layer (ETL) and/or an electron injection layer (EIL).

The emission layer 222b may have a shape patterned to correspond to an opening of the pixel-defining layer 211 and overlap the pixel electrode 221. In contrast, the first functional layer 222a and the second functional layer 222c may be integrally formed to correspond to the plurality of pixel electrodes 221.

A spacer 213 may be located over the pixel-defining layer 211. The spacer 213 may be simultaneously formed in the same process when the pixel-defining layer 211 is formed, or may be formed in a separate process different from the process of forming the pixel-defining layer 211. The spacer 213 may include an organic insulating material, such as polyimide.

As the organic light-emitting diode OLED is likely damaged by moisture or oxygen from the outside, an encapsulation layer 300 may cover and protect the organic light-emitting diode OLED. The encapsulation layer 300 may include at least one organic encapsulation layer and at least one inorganic encapsulation layer. FIG. 6 illustrates that the encapsulation layer 300 includes a first inorganic encapsulation layer 310, a second inorganic encapsulation layer 330, and an organic encapsulation layer 320 therebetween.

Each of the first and second inorganic encapsulation layers 310 and 330 may include at least one inorganic material from among aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acryl-based resin, an epoxy-based resin, polyimide, and/or polyethylene. For example, the organic encapsulation layer 320 may include an acryl-based resin, e.g., polymethyl methacrylate, and/or polyacrylic acid. The organic encapsulation layer 320 may be formed by curing a monomer or applying a polymer.

The display panel 10 may include the input sensing layer 40. The input sensing layer 40 may include a first touch insulating layer 401 located on the second inorganic encapsulation layer 330, a first conductive layer 402 on the first touch insulating layer 401, a second touch insulating layer 403 on the first conductive layer 402, a second conductive layer 404 on the second touch insulating layer 403, and a third touch insulating layer 405 on the second conductive layer 404.

Each of the first touch insulating layer 401, the second touch insulating layer 403, and the third touch insulating layer 405 may include an inorganic insulating material and/or an organic insulating material. For example, each of the first touch insulating layer 401 and the second touch insulating layer 403 may include an inorganic insulating material, such as silicon oxide, silicon nitride or silicon oxynitride, and the third touch insulating layer 405 may include an organic insulating material.

A touch electrode TE of the input sensing layer 40 may include, e.g., a structure in which the first conductive layer 402 and the second conductive layer 404 are connected to each other. Each of the first conductive layer 402 and the second conductive layer 404 may include Al, Cu, or Ti, and may have a single-layer structure or a multi-layer structure. For example, each of the first conductive layer 402 and the second conductive layer 404 may have a three-layer structure including Ti/Al/Ti.

As described above with reference to FIG. 5, the first bypass portion DL-C1 and the second bypass portion DL-C2 may be positioned in the intermediate area MA. As shown in FIG. 6, the intermediate area MA may include a first sub-intermediate area SMA1 in which the first bypass portion DL-C1 and the second bypass portion DL-C2 are positioned. The intermediate area MA may also include a second sub-intermediate area SMA2 (see FIG. 7) to be described below, in addition to the first sub-intermediate area SMA1.

Second bypass portions DL-C2 are shown in FIG. 6, and the second bypass portions DL-C2 may be located on the second interlayer insulating layer 207 or on the third interlayer insulating layer 209. The second bypass portions DL-C2 that appear to be adjacent to each other in a plan view viewed from a direction perpendicular to the substrate 100 may be positioned on different layers. That is, when one second bypass portion DL-C2 is located on the third interlayer insulating layer 209, the second bypass portion DL-C2 adjacent thereto may be located on the second interlayer insulating layer 207. Accordingly, a pitch Ad between the second bypass portions DL-C2 adjacent to each other may be reduced, and thus, the intermediate area MA may be efficiently used. This also applies to first bypass portions DL-C1.

A dummy emission layer 222b' may be positioned in the first sub-intermediate area SMA1. The dummy emission layer 222b' is spaced apart from the emission layer 222b. In addition, because the dummy emission layer 222b' is positioned in the first sub-intermediate area SMA1 and the second sub-intermediate area SMA2 is between the first sub-intermediate area SMA1 and the opening 10OP of the display panel 10 as described below, an end of the dummy emission layer 222b' in a direction to an opening of the substrate 100 is not exposed by the opening 10OP of the display panel 10. The dummy emission layer 222b' may be simultaneously formed with the same material as the emission layer 222b.

Figure 7:
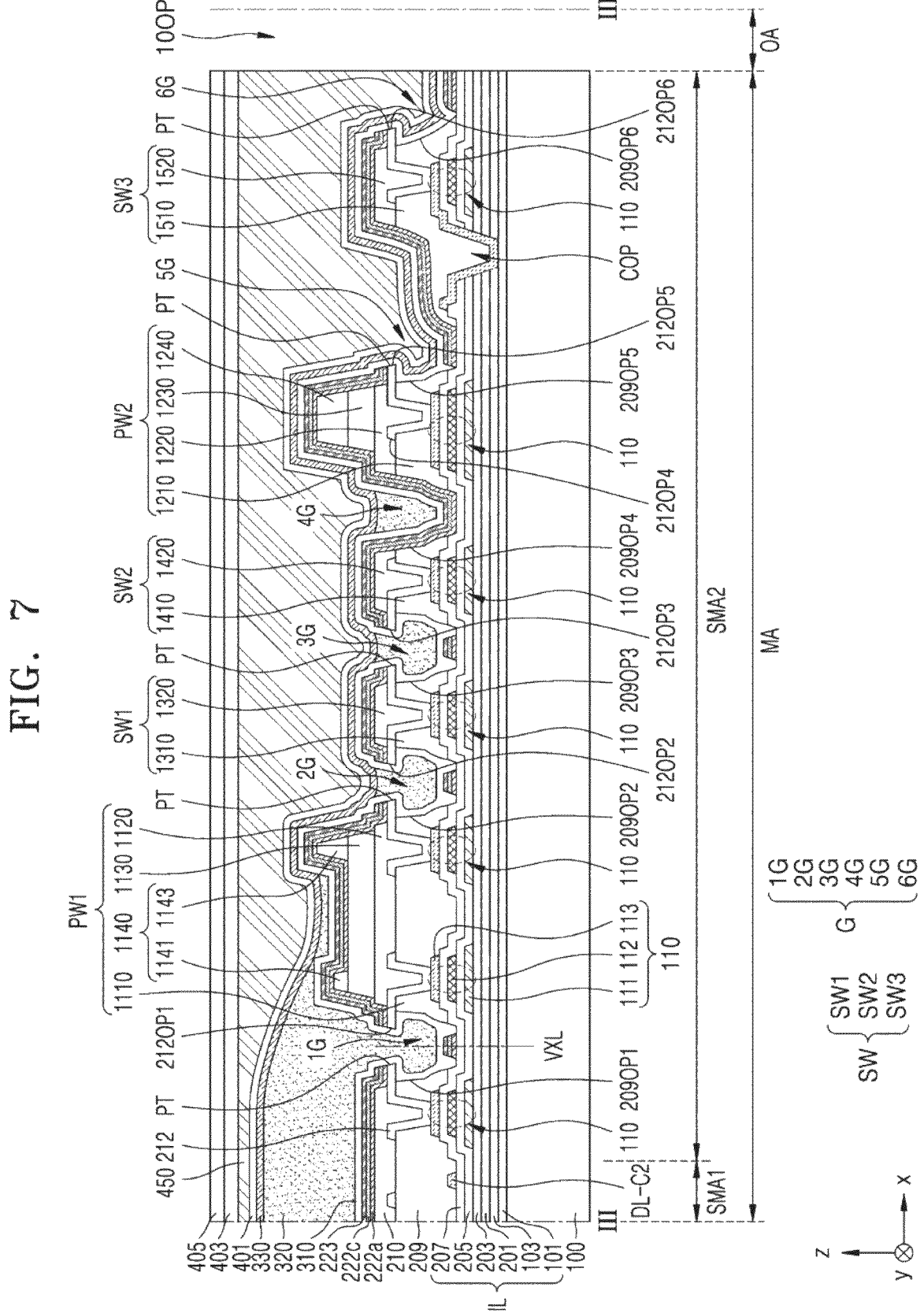
FIG. 7 is a schematic cross-sectional view of a cross-section of the display panel of FIG. 5 taken along a line III-III'.

FIG. 7 is a schematic cross-sectional view of a cross-section of the display panel 10 of FIG. 5 taken along a line III-III'. As shown in FIG. 7, in addition to the first sub-intermediate area SMA1 in which the first bypass portion DL-C1 and the second bypass portion DL-C2 are positioned as described above, the intermediate area MA may also include the second sub-intermediate area SMA2 between the first sub-intermediate area SMA1 and the opening area OA. The grooves G and partition walls may be arranged in the second sub-intermediate area SMA2, and the encapsulation layer 300 (see FIG. 6) over the display area DA may extend to the intermediate area MA and cover the grooves G and the partition walls.

The grooves G positioned in the second sub-intermediate area SMA2 may be spaced apart from each other. FIG. 7 illustrates that a first groove 1G to a sixth groove 6G are arranged in a direction from the first sub-intermediate area SMA1 to the opening area OA. As described above with reference to FIG. 5, the first to sixth grooves 1G to 6G may appear to have a closed loop shape surrounding the opening area OA in a plan view viewed from a direction (z-axis direction) substantially perpendicular to the substrate 100. A portion of the sixth groove 6G may overlap the opening area OA. For example, when viewed from the direction (z-axis direction) perpendicular to the substrate 100, the opening area OA may be positioned inside the sixth groove 6G.

The grooves G may pass through at least one insulating layer formed on the substrate 100. Each of the grooves G may pass through at least the third interlayer insulating layer 209. FIG. 7 illustrates that each of the first to sixth grooves 1G to 6G passes through the planarization layer 210 and the third interlayer insulating layer 209. The first to sixth grooves 1G to 6G may be formed by removing portions of the planarization layer 210 and the third interlayer insulating layer 209 using etching.

A plurality of inorganic insulating layers IL may be positioned directly below the grooves G. The plurality of inorganic insulating layers IL may include the first barrier layer 101, the second barrier layer 103, the buffer layer 201, the gate insulating layer 203, the first interlayer insulating layer 205, and the second interlayer insulating layer 207. The grooves G may expose portions of the plurality of inorganic insulating layers IL. That is, bottom surfaces of the grooves G may be top surfaces of one of the plurality of inorganic insulating layers IL. FIG. 7 illustrates a case in which bottom surfaces of the first to sixth grooves 1G to 6G are top surfaces of the second interlayer insulating layer 207 positioned at the top of the plurality of inorganic insulating layers IL. When the first to sixth grooves 1G to 6G are formed by etching the planarization layer 210 and the third interlayer insulating layer 209, at least portions of the plurality of inorganic insulating layers IL may be etched together.

As described above, the grooves G are not formed in the substrate 100 and at least one of the plurality of inorganic insulating layers IL is between the substrate 100 and the grooves G, and accordingly, impurities, such as moisture, that may be introduced through the substrate 100 may be blocked by the plurality of inorganic insulating layers IL.

At least one of the grooves G may include a tip PT. As shown in FIG. 7, each of the first groove 1G, the second groove 2G, the third groove 3G, the fifth groove 5G, and the sixth groove 6G may include at least one tip PT. For example, the first groove 1G may have a pair of tips PT positioned on both sides of a virtual vertical line VXL that passes through the center of the first groove 1G and is perpendicular to the substrate 100. Similar to the first groove 1G, each of the second groove 2G and the third groove 3G may also have a pair of tips PT positioned on both sides of a virtual vertical line that passes through the center of each of the second groove 2G and the third groove 3G and is perpendicular to the substrate 100. In addition, there may be grooves having one tip PT, such as the fifth groove 5G and the sixth groove 6G.

The tip PT may be formed by a metal pattern layer 212 located on the third interlayer insulating layer 209. The metal pattern layer 212 may be a portion of the second electrode layer including the data line DL and/or the driving voltage line PL described above with reference to FIG. 6. Accordingly, the metal pattern layer 212 may be simultaneously formed with the same material to have the same structure as the data line DL and/or the driving voltage line PL.

The metal pattern layer 212 may have opening patterns overlapping the grooves G. For example, the metal pattern layer 212 may have a first opening pattern 212OP1 overlapping the first groove 1G, and both side boundaries of the first groove 1G defined by a first opening 209OP1 of the third interlayer insulating layer 209 may be arranged farther from a virtual vertical line VXL passing through the center of the first groove 1G than both side boundaries of the first opening pattern 212OP1. Accordingly, each end of the metal pattern layer 212 may protrude toward the center of the first groove 1G, such that the tip PT is formed.

Similarly, a second opening pattern 212OP2 is positioned to overlap the second groove 2G, and a third opening pattern 212OP3 is positioned to overlap the third groove 3G. Both side boundaries of the second groove 2G defined by a second opening 209OP2 of the third interlayer insulating layer 209 may be arranged farther from a virtual vertical line passing through the center of the second groove 2G than both side boundaries of the second opening pattern 212OP2, and both side boundaries of the third groove 3G defined by a third opening 209OP3 of the third interlayer insulating layer 209 may be arranged farther from a virtual vertical line passing through the center of the third groove 3G than both side boundaries of the third opening pattern 212OP3. Each end of the metal pattern layer 212 protrudes toward centers of the second groove 2G and the third groove 3G, such that tips PT may be formed.

The fourth groove 4G may not include a tip PT. For example, a fourth opening pattern 212OP4 of the metal pattern layer 212 overlaps the fourth groove 4G, and both side boundaries of the fourth groove 4G may be closer to a virtual vertical line passing through the center of the fourth groove 4G than both side boundaries of the fourth opening pattern 212OP4. Accordingly, the inner surface of a fourth opening 209OP4 of the third interlayer insulating layer 209 may be smoothly connected to the inner surface of a fourth opening of the planarization layer 210.

The fifth groove 5G may include one tip PT positioned on the first sub-intermediate area SMA1 side. For example, a fifth opening pattern 212OP5 of the metal pattern layer 212 overlaps the fifth groove 5G. A boundary of the fifth groove 5G defined by a fifth opening 209OP5 of the third interlayer insulating layer 209 on the first sub-intermediate area SMA1 side may be farther from a virtual vertical line passing through the center of the fifth groove 5G than a boundary of the fifth opening pattern 212OP5 in a direction to the first sub-intermediate area SMA1, and the other side boundary of the fifth groove 5G may be closer to the virtual vertical line passing through the center of the fifth groove 5G than the other side boundary of the fifth opening pattern 212OP5. Accordingly, a boundary of the metal pattern layer 212 in the direction to the first sub-intermediate area SMA1 protrudes toward the center of the fifth groove 5G, such that the tip PT may be formed.

The sixth groove 6G may include one tip PT positioned in the direction to the first sub-intermediate area SMA1. For example, a sixth opening pattern 212OP6 of the metal pattern layer 212 overlaps the sixth groove 6G defined by a sixth opening 209OP6 of the third interlayer insulating layer 209, and a boundary of the sixth groove 6G in the direction to the first sub-intermediate area SMA1 may be farther from a virtual vertical line passing through the center of the sixth groove 6G than a boundary of the sixth opening pattern 212OP6 in the direction to the first sub-intermediate area SMA1. Accordingly, a boundary of the metal pattern layer 212 in the direction to the first sub-intermediate area SMA1 protrudes toward the center of the sixth groove 6G, such that the tip PT may be formed.

Some of layers included in the organic light-emitting diode OLED, e.g., the first functional layer 222a and the second functional layer 222c, are formed not only in the display area DA but also in the intermediate area MA, and may be exposed on the inner surface of the opening 10OP of the display panel 10. However, the first functional layer 222a and the second functional layer 222c may be disconnected by the grooves G including the tip PT. The opposite electrode 223 may be disconnected or separated by the grooves G including the tip PT. FIG. 7 illustrates that the first functional layer 222a, the second functional layer 222c, and the opposite electrode 223 are disconnected and separated by the tips PT of the first groove 1G, the second groove 2G, the third groove 3G, the fifth groove 5G, and the sixth groove 6G. In contrast, the first functional layer 222a, the second functional layer 222c, and the opposite electrode 223 may be continuously formed without being disconnected by the fourth groove 4G.

Impurities, such as moisture, may move toward the display area DA through the inner surface of the opening 10OP of the display panel 10. When the first functional layer 222a and the second functional layer 222c are continuously connected to the display area DA, the first functional layer 222a and the second functional layer 222c may serve as a moving passage for impurities, such as moisture. However, as shown in FIG. 7, because the first functional layer 222a and the second functional layer 222c are disconnected by the grooves G each including the tip PT, impurities, such as moisture, moving toward the display area DA may be prevented or reduced.

A metal dummy stack 110 may be arranged around the grooves G. For example, the metal dummy stack 110 may be arranged on both sides of each of the grooves G. The metal dummy stack 110 is a type of mound and may increase the depth of a groove G. FIG. 7 illustrates that the metal dummy stack 110 includes three metal layers, e.g., a first metal layer 111, a second metal layer 112, and a third metal layer 113, overlapping each other with an insulating layer therebetween.

The first to third metal layers 111 to 113 may be positioned on the same layer and include the same material as the electrodes of the thin-film transistors and the storage capacitor described above with reference to FIG. 6. For example, the first metal layer 111 and the gate electrode GE1 may be positioned on the same layer and include the same material. The second metal layer 112 and the upper electrode CE2 of the storage capacitor may be positioned on the same layer and include the same material. The third metal layer 113 and the first electrode layer located over the second interlayer insulating layer 207 may include the same material. Although FIG. 7 illustrates that the metal dummy stack 110 includes three metal layers, embodiments according to the present disclosure are not limited thereto. For example, the number of metal layers in the metal dummy stack 110 may be less than 3 or more than 3.

In addition, an opening COP may be between the fifth groove 5G and the sixth groove 6G, the opening COP being formed by etching a portion of at least one of the plurality of inorganic insulating layers IL. FIG. 7 illustrates as an example that the opening COP is formed by etching portions of the second barrier layer 103, the buffer layer 201, the gate insulating layer 203, the first interlayer insulating layer 205, and the second interlayer insulating layer 207 among the plurality of inorganic insulating layers IL. At least one of a plurality of metal layers included in the metal dummy stack 110 may extend and overlap the opening COP. FIG. 7 illustrates as an example that the third metal layer 113 extends and overlaps the opening COP.

The opening COP may separate inorganic insulating layers in a direction to the first sub-intermediate area SMA1 from inorganic insulating layers in a direction to the opening area OA and thus may prevent or reduce instances of cracks occurring in the inorganic insulating layers in the direction to the opening area OA when the opening 10OP of the display panel 10 is formed from spreading to the inorganic insulating layers in the direction to the first sub-intermediate area SMA1. In this case, the at least one of the plurality of metal layers included in the metal dummy stack 110 covers the opening COP of the plurality of inorganic insulating layers IL, and accordingly, impurities, such as moisture or other contaminants, moving from the third interlayer insulating layer 209 to the substrate 100 through the opening COP may be prevented or reduced.

A portion of the grooves G, e.g., the fourth groove 4G, may not include the tip PT. The fourth groove 4G may be used for monitoring an area in which the organic encapsulation layer 320 is formed when the organic encapsulation layer 320 of the encapsulation layer 300 is formed.

The organic encapsulation layer 320 may be formed by applying a monomer and then curing the same. The monomer has fluidity, and a position of the monomer needs to be identified. A position of the organic encapsulation layer 320 may be measured by using an amount of light irradiated to the display panel 10 and reflected therefrom. Because the tip PT including a metal affects reflectance of light used for monitoring the organic encapsulation layer 320, when all the grooves G include the tip PT, the position of the organic encapsulation layer 320 may be difficult to be identified. However, the display panel 10 includes the fourth groove 4G not having the tip PT and/or a groove 5G and/or 6G having the tip PT only on one side thereof, and accordingly, the aforementioned problem may be prevented or significantly reduced.

In addition to the aforementioned grooves G, partition walls may be positioned in the intermediate area MA. A first partition wall PW1 and a second partition wall PW2 are shown in FIG. 7. The first partition wall PW1 may include first through fourth partition wall layers 1110, 1120, 1130, and 1140. The first through fourth partition wall layers 1110, 1120, 1130, and 1140 may include the same material as that of the third interlayer insulating layer 209, the second organic insulating layer 210, the pixel-defining layer 211, and the spacer 213, respectively. The fourth partition wall layer 1140 may include a first protrusion 1141 and a second protrusion 1143 which will be described later. The second partition wall PW2 may include first through fourth partition wall layers 1210, 1220, 1230, and 1240. The first through fourth partition wall layers 1210, 1220, 1230, and 1240 may include the same material as that of the third interlayer insulating layer 209, the second organic insulating layer 210, the pixel-defining layer 211, and the spacer 213, respectively. The grooves G may be spaced apart from each other in the second sub-intermediate area SMA2. The first partition wall PW1 may be between the first groove 1G and the second groove 2G. Accordingly, the first groove 1G may be between the first partition wall PW1 and the first sub-intermediate area SMA1. In other words, the first groove 1G may be between the first partition wall PW1 and the display area DA. The second groove 2G, the third groove 3G, and the fourth groove 4G may be between the first partition wall PW1 and the second partition wall PW2, and the fifth groove 5G and the sixth groove 6G may be between the second partition wall PW2 and the opening area OA.

Sub-partition walls SW that separate the grooves G may be between the first partition wall PW1 and the second partition wall PW2 and between the second partition wall PW2 and the opening area OA. For example, a first sub-partition wall SW1 may be between the second groove 2G and the third groove 3G, and a second sub-partition wall SW2 may be between the third groove 3G and the fourth groove 4G. Similarly, a third sub-partition wall SW3 may be between the fifth groove 5G and the sixth groove 6G. The first sub-partition wall SW1 may include first and second sub-partition wall layers 1310 and 1320. The first and second sub-partition wall layers 1310 and 1320 may include the same material as that of the third interlayer insulating layer 209 and the second organic insulating layer 210, respectively. Similarly, the second sub-partition wall SW2 may include first and second sub-partition wall layers 1410 and 1420. The first and second sub-partition wall layers 1410 and 1420 may include the same material as that of the third interlayer insulating layer 209 and the second organic insulating layer 210, respectively.

The grooves G between the first partition wall PW1 and the second partition wall PW2 may be filled with the organic encapsulation layer 320. FIG. 7 illustrates that the second groove 2G, the third groove 3G, and the fourth groove 4G are filled with the organic encapsulation layer 320 in an area between the first partition wall PW1 and the second partition wall PW2. The organic encapsulation layer 320 may cover the tips PT of the grooves G between the first partition wall PW1 and the second partition wall PW2. For example, a pair of tips PT arranged on both sides of each of the second groove 2G and the third groove 3G may be sufficiently covered up to the top surface by the organic encapsulation layer 320. When the tips PT of the grooves G between the first partition wall PW1 and the second partition wall PW2 are not filled by the organic encapsulation layer 320, cracks may occur in the second inorganic encapsulation layer 330 positioned adjacent to the tips PT. Accordingly, the organic encapsulation layer 320 fills the tips PT, which may prevent or significantly reduce the aforementioned problem from occurring.

The first inorganic encapsulation layer 310 of the encapsulation layer 300 may continuously cover the inner surfaces of the grooves G, and the organic encapsulation layer 320 may cover the first sub-intermediate area SMA1 and partially cover the second sub-intermediate area SMA2. The organic encapsulation layer 320 may cover portions of the grooves G, e.g., the first groove 1G between the first partition wall PW1 and the first sub-intermediate area SMA1, and the second to fourth grooves 2G to 4G between the first partition wall PW1 and the second partition wall PW2. The second inorganic encapsulation layer 330 may entirely cover the intermediate area MA on the organic encapsulation layer 320.

The first partition wall PW1 may include a plurality of protrusions to control flow of the monomer when the organic encapsulation layer 320 is formed. FIG. 7 illustrates as an example that the first partition wall PW1 has the first protrusion 1141 and the second protrusion 1143 spaced apart from each other. A height of the first partition wall PW1 may be asymmetrical. For example, a height of the first protrusion 1141 is formed to be lower than a height of the second protrusion 1143, such that a margin for an inkjet printing process may be secured. The second protrusion 1143 may protrude onto the organic encapsulation layer 320 to disconnect or separate the organic encapsulation layer 320. On the second protrusion 1143, a portion of the second inorganic encapsulation layer 330 may be in direct contact with a portion of the first inorganic encapsulation layer 310.

In the intermediate area MA, the organic encapsulation layer 320 may be discontinuous due to a structure of the first partition wall PW1 or the like. For example, as shown in FIGS. 6 and 7, a portion of the organic encapsulation layer 320 may cover the display area DA and the first sub-intermediate area SMA1, and another portion thereof may cover an area between the first partition wall PW1 and the second partition wall PW2. That is, an end of the organic encapsulation layer 320 is positioned on one side of the second partition wall PW2 in a direction (−x direction) of the display area DA and does not extend toward the opening area OA. Accordingly, a portion of the second inorganic encapsulation layer 330 may be in direct contact with a portion of the first inorganic encapsulation layer 310 on the upper surface of the second partition wall PW2. In addition, the second inorganic encapsulation layer 330 may be in direct contact with the first inorganic encapsulation layer 310 between the second partition wall PW2 and the opening area OA.

The touch insulating layers described above with reference to FIG. 6 may extend to the intermediate area MA. In this regard, FIG. 7 illustrates that the first to third touch insulating layers 401 to 405 extend to the intermediate area MA.

An additional planarization layer 450 may be positioned in the intermediate area MA. The additional planarization layer 450 may planarize the intermediate area MA. The additional planarization layer 450 may be positioned in the intermediate area MA and may cover a structure provided below the additional planarization layer 450. The additional planarization layer 450 may be positioned only in the intermediate area MA and may not be present in the display area DA. In this regard, FIG. 6 illustrates that an external edge 450e of the additional planarization layer 450 in the direction to the display area DA is not positioned in the display area DA. Accordingly, in the display area DA adjacent to the external edge 450e of the additional planarization layer 450, the first touch insulating layer 401 and the second touch insulating layer 403 may be in direct contact with each other.

As shown in FIG. 7, the display panel 10 includes the opening 10OP. The opening 10OP of the display panel 10 may include openings of elements constituting the display panel 10. For example, the opening 10OP of the display panel 10 may include an opening of the substrate 100, an opening of the first inorganic encapsulation layer 310, an opening of the second inorganic encapsulation layer 330, and an opening of the additional planarization layer 450.

The openings may be simultaneously formed. For example, the opening 10OP may be formed by irradiating a laser beam to remove portions of the substrate 100, the first inorganic encapsulation layer 310, the second inorganic encapsulation layer 330, and the additional planarization layer 450. Accordingly, the inner surface of the substrate 100 defining the opening of the substrate 100 and the inner surface of the additional planarization layer 450 defining an opening of the additional planarization layer 450 may form a continuous surface.

Figure 8:
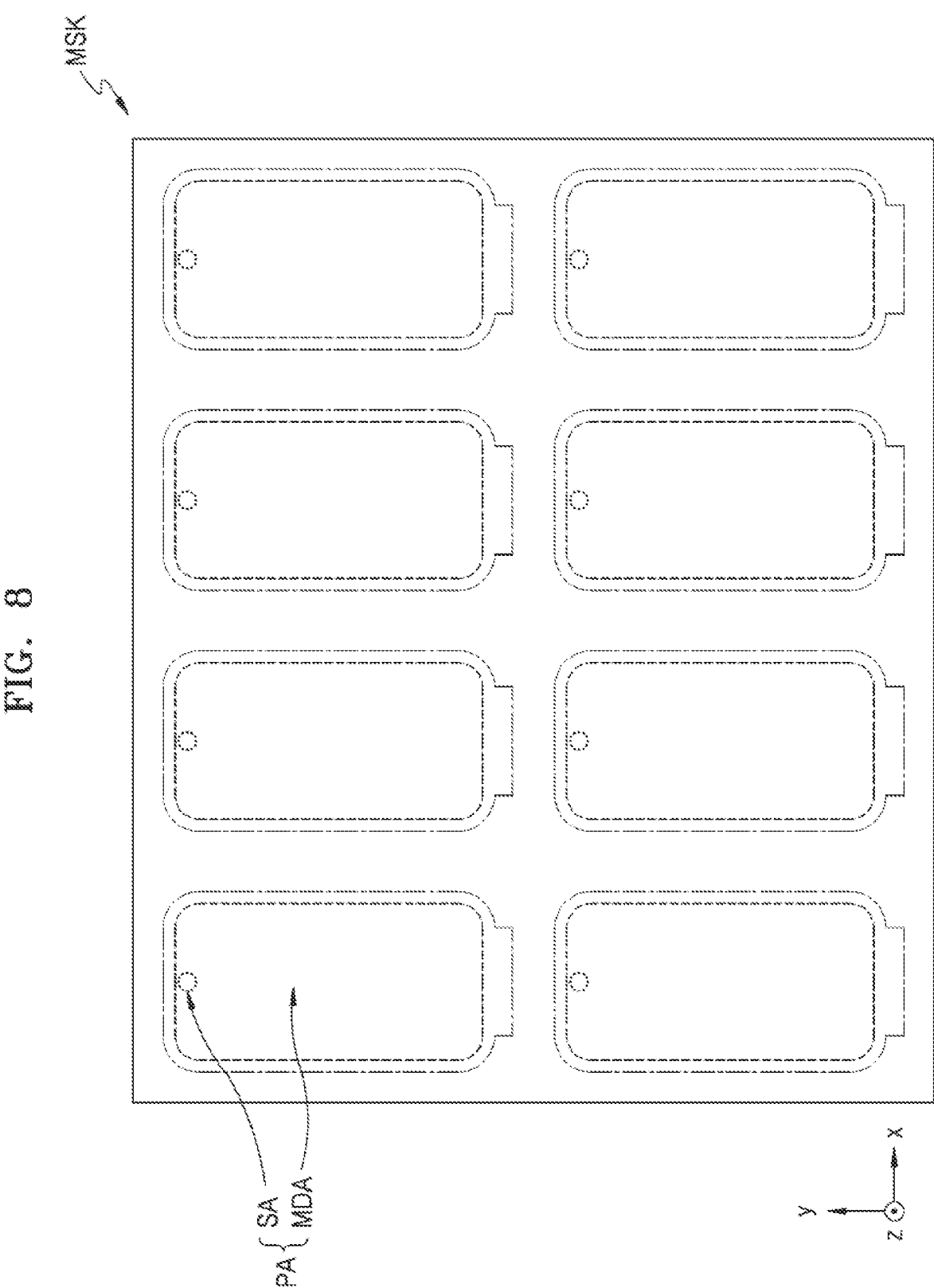
FIG. 8 is a schematic plan view of a mask that may be used to manufacture the display apparatus of FIG. 1.
Figure 9:
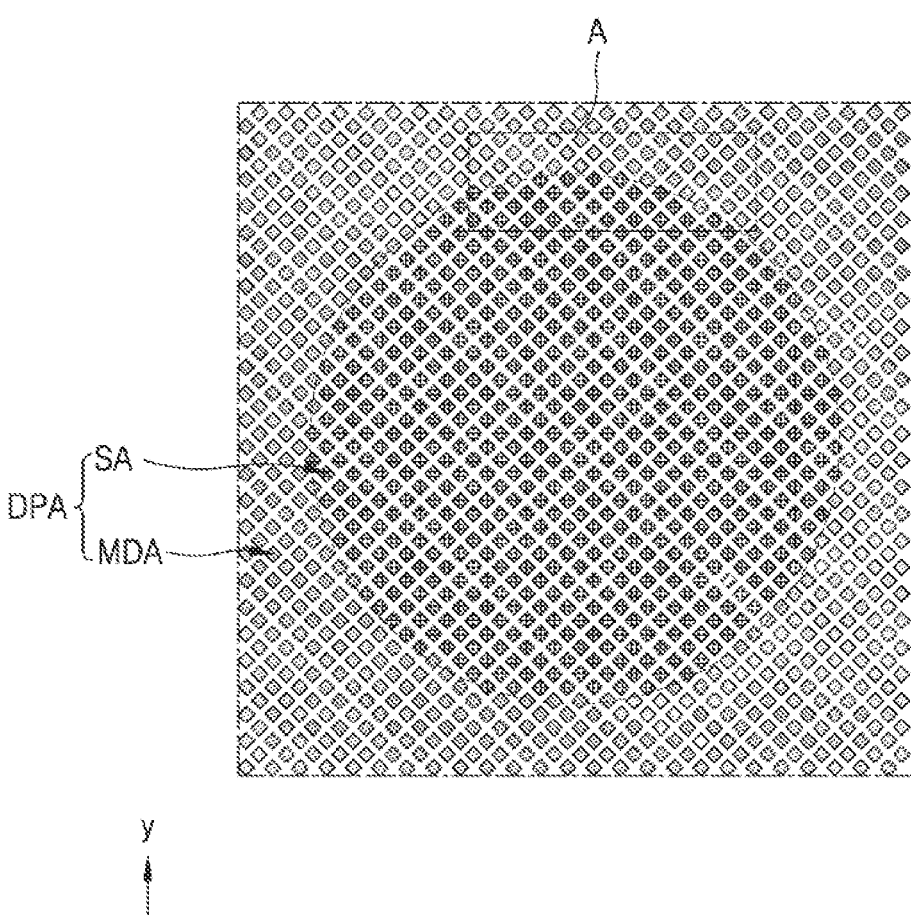
FIG. 9 is a schematic backside view of an area of the mask of FIG. 8.
Figure 10:
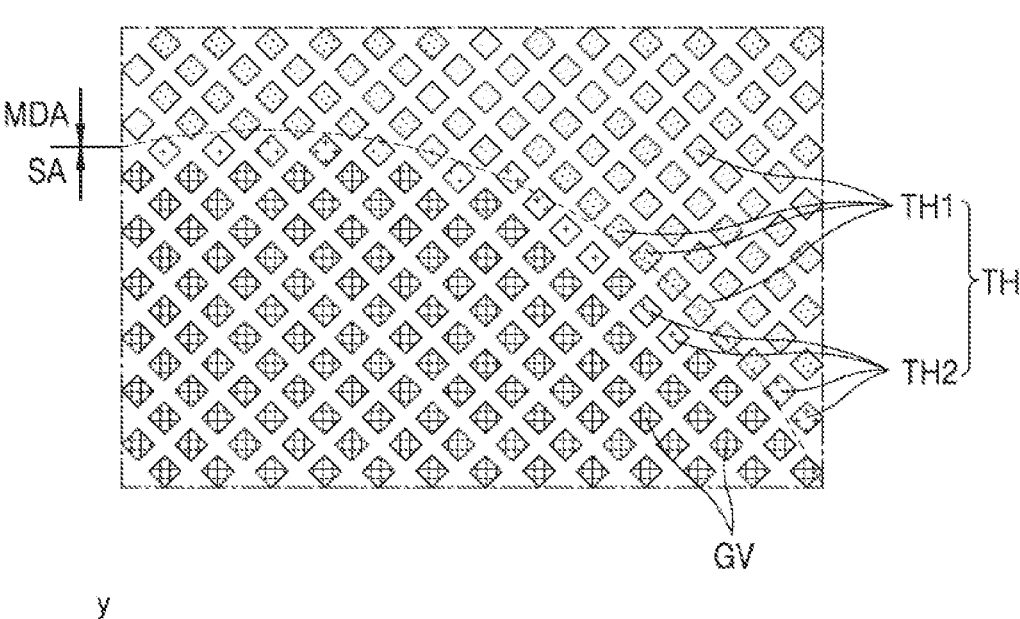
FIG. 10 is an enlarged backside view of an area A of the mask of FIG. 9.

FIG. 8 is a schematic plan view of a mask MSK that may be used to manufacture the display apparatus 1 of FIG. 1, FIG. 9 is a schematic backside view of an area of the mask MSK of FIG. 8, and FIG. 10 is an enlarged backside view of an area A of the mask MSK of FIG. 9. The mask MSK may be used when the emission layer 222b and the dummy emission layer 222b' of the display apparatus 1 are formed. That is, the mask MSK is a mask for depositing an emission layer.

The mask MSK includes a plurality of deposition areas DPA. The plurality of deposition areas DPA may correspond to a plurality of display panels 10, respectively. That is, the plurality of display panels 10 may be simultaneously manufactured.

Each of the plurality of deposition areas DPA may include a sensor area SA and a main deposition area MDA. The sensor area SA may correspond to the opening area OA of the display panel 10. An area of the sensor area SA may be greater than an area of the opening area OA as described below. The main deposition area MDA is positioned on the outside of the sensor area SA to surround the sensor area SA, and a plurality of through-holes TH are arranged at regular intervals such that a deposition material may pass therethrough. The through-holes TH may include first through-holes TH1 and second through-holes TH2. A material for forming the emission layer 222b may pass through the first through-holes TH1.

The display apparatus 1 may include red emission layers, green emission layers, and blue emission layers, which are arranged in the display area DA. The emission layers may be formed by deposition. The red emission layers may be simultaneously formed by a mask for a red emission layer, the green emission layers may be simultaneously formed by a mask for a green emission layer, and the blue emission layers may also be simultaneously formed by a mask for a blue emission layer. The mask MSK in FIGS. 8 to 10 may be, e.g., the mask for the red emission layer.

There is no through-hole in the sensor area SA of the mask MSK. Instead, in the sensor area SA, a plurality of grooves GV are arranged at regular intervals.

When the emission layer is formed using the mask MSK, a tensile force is applied to the mask MSK to prevent or reduce sagging of the mask MSK. Accordingly, the mask MSK needs to have a uniform structure. This is because, when the structure of the mask MSK is not uniform, stress caused by the tensile force applied to the mask MSK is unevenly generated, and thus, the life of the mask MSK may be significantly reduced. Accordingly, if no through-hole is positioned in the sensor area SA of the mask MSK while the plurality of through-holes TH are arranged in the main deposition area MDA of the mask MSK, the life of the mask MSK may be significantly reduced. However, in the case of the mask MSK, the plurality of grooves GV arranged at regular intervals are present in the sensor area SA, and thus, the occurrence of such a defect in the mask MSK may be effectively prevented or significantly reduced.

Also, through-holes may be considered to be present in the sensor area SA of the mask MSK as in the main deposition area MDA. However, in this case, the possibility of occurrence of a defect in manufacturing the display apparatus 1 is very high. When the display panel 10 is manufactured, the opening 10OP may be formed by irradiating a laser beam to the display panel 10 and removing portions of the substrate 100, the first inorganic encapsulation layer 310, the second inorganic encapsulation layer 330, and the additional planarization layer 450 as described above. If there are through-holes in the sensor area SA of the mask MSK as in the main deposition area MDA, dummy emission layers are also present in an area where the opening 10OP of the display panel 10 is to be formed. Accordingly, some of the dummy emission layers are also removed in a process of forming the opening 10OP by irradiating a laser beam to the display panel 10, and impurities may be formed in a dummy emission layer removed in this process, which may cause a defect in the display panel 10.

In the case of the mask MSK according to some embodiments, only the plurality of grooves GV arranged at regular intervals are present in the sensor area SA. Accordingly, the dummy emission layer is not formed in the area where the opening 10OP of the display panel 10 is to be formed. As a result, the occurrence of a defect in the process of forming the opening 10OP by irradiating a laser beam to the display panel 10 may be effectively prevented or significantly reduced.

For reference, as shown in FIG. 7, the first functional layer 222a and/or the second functional layer 222c may be exposed on the inner surface of the opening 10OP of the display panel 10. This is because, when the first functional layer 222a or the second functional layer 222c is formed by deposition in a process of manufacturing the display apparatus 1, unlike the emission layer 222b and the dummy emission layer 222b', the first functional layer 222a or the second functional layer 222c is formed to correspond to an entire area of the substrate 100 before an opening is formed, and then, a portion of the display panel 10 is removed such that the opening 10OP is formed. However, because a thickness of the first functional layer 222a or the second functional layer 222c is much less than thicknesses of the emission layer 222b and the dummy emission layer 222b', a defect is not caused in a process of forming the opening 10OP by removing a portion of the display panel 10.

As described above, when the first functional layer 222a or the second functional layer 222c is formed by deposition, the first functional layer 222a or the second functional layer 222c is formed to correspond to the entire area of the substrate 100 before the opening is formed, and then, a portion of the display panel 10 is formed such that the opening 10OP is formed. Accordingly, the first functional layer 222a has a first through-hole corresponding to the opening of the substrate 100, and the second functional layer 222c also has a second through-hole corresponding to the opening of the substrate 100. In addition, an area of the first through-hole of the first functional layer 222a an area of the second through-hole of the second functional layer 222c are equal to an area of the opening of the substrate 100. Also, the inner surface of the first through-hole of the first functional layer 222a, the inner surface of the second through-hole of the second functional layer 222c, and the inner surface of the opening of the substrate 100 may form a continuous surface.

Moreover, the first through-holes TH1 of the mask MSK are through-holes used in forming the emission layer 222b positioned in the display area DA of the display panel 10, and the second through-holes TH2 of the mask MSK are through-holes used in forming the dummy emission layer 222*b*' positioned in the first sub-intermediate area SMA1 of the display panel 10. When there are no second through-holes TH2, among the first through-holes TH1, surrounding environments of first through-holes TH1 closest to the opening area OA may be different from surrounding environments of first through-holes TH1 positioned at the center of the display area DA. This is because the first through-holes TH1 positioned at the center of the display area DA are surrounded by other first through-holes TH1 in all directions, but in the case of a first through-hole TH1 closest to the opening area OA, other first through-holes TH1 are present only on one side of the first through-hole TH1. When the surrounding environments are different, areas or thicknesses of emission layers formed through the through-holes may not be uniform. Accordingly, as the second through-holes TH2 are present, surrounding environments of all the first through-holes TH1 are identical or similar to each other, and thus, a high-quality display apparatus may be manufactured.

For reference, the dummy emission layer 222*b*' apart from the emission layer 222*b* is positioned in the first sub-intermediate area SMA1, and the second sub-intermediate area SMA2 is between the first sub-intermediate area SMA1 and the opening 10OP of the display panel 10, as described above, and thus, an end of the dummy emission layer 222*b*' in a direction to the opening 100OP of the substrate 100 is not exposed by the opening 10OP of the display panel 10. This is because a portion of the display panel 10 surrounded by the second sub-intermediate area SMA2 is removed when the opening 10OP is formed.

Figure 11:
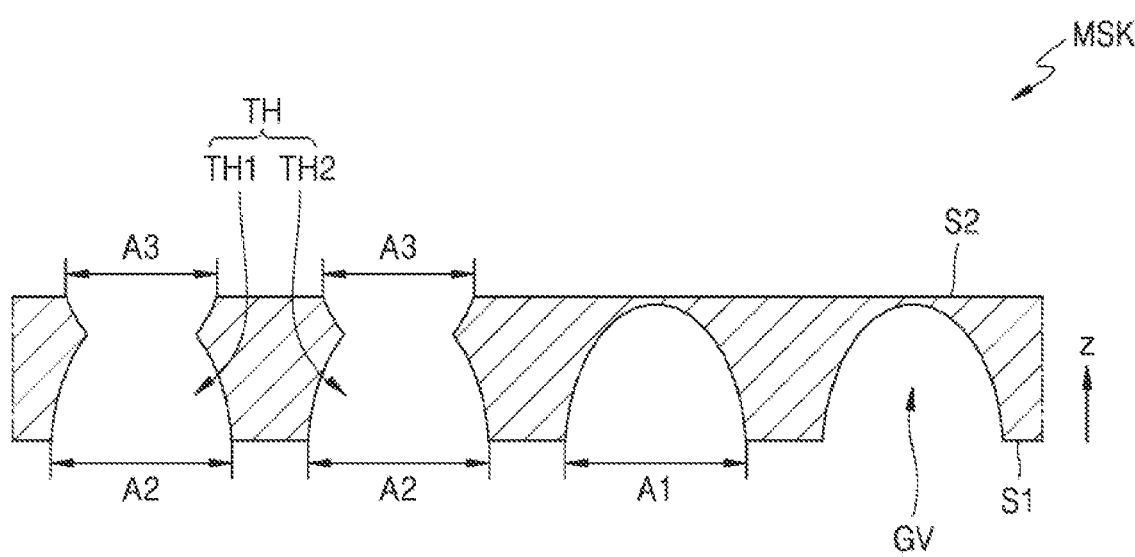
FIG. 11 is a schematic cross-sectional view of an area of the mask of FIG. 9.

FIG. 11 is a schematic cross-sectional view of an area of the mask MSK of FIG. 9. A portion of the main deposition area MDA and a portion of the sensor area SA are shown in FIG. 11. As shown in FIG. 11, the plurality of grooves GV positioned in the sensor area SA are located in a first surface S1 (in a −z direction) of the mask MSK. In addition, the plurality of through-holes TH positioned in the main deposition area MDA pass through the first surface S1 and a second surface S2 opposite to the first surface S1.

A first area A1 of each of the plurality of grooves GV in the first surface S1 may be equal to a second area A2 of each of the plurality of through-holes TH in the first surface S1. When necessary, the first area A1 of each of the plurality of grooves GV in the first surface S1 may be less than the second area A2 of each of the plurality of through-holes TH in the first surface S1. In addition, a third area A3 of each of plurality of the through-holes TH in the second surface S2 may be less than the second area A2. Moreover, a depth of each of the plurality of grooves GV may be greater than half of a thickness between the first surface S1 and the second surface S2.

Figure 12:
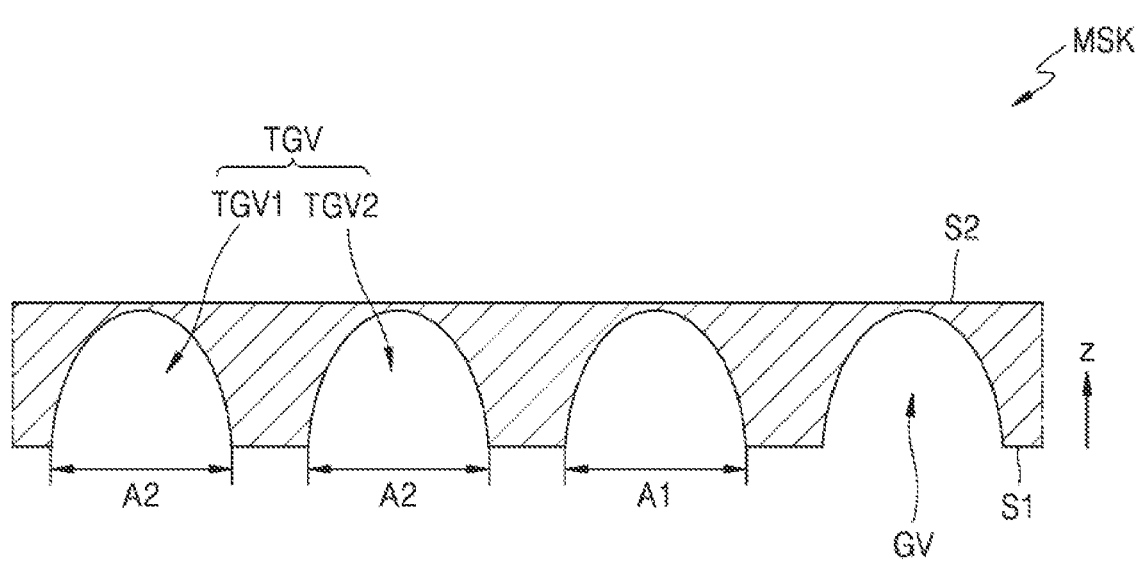
FIG. 12 is a conceptual view of a process of manufacturing the mask of FIG. 11.

As shown in FIG. 12 which is a conceptual view of a process of manufacturing the mask MSK of FIG. 11, a mask plate (i.e., a preliminary mask for forming the mask MSK) including the sensor area SA and the main deposition area MDA positioned outside the sensor area SA to surround the sensor area SA is provided, and then the plurality of grooves GV positioned in the sensor area SA and a plurality of temporary grooves TGV positioned in the main deposition area MDA are simultaneously formed in the first surface S1 of the mask plate. The temporary grooves TGV may include a first temporary groove TGV1 for a first through-hole TH1 and a second temporary groove TGV2 for a second through-hole TH2. The mask plate for forming the mask MSK may include an alloy of nickel and iron, e.g., Invar. The plurality of grooves GV and the plurality of temporary grooves TGV may be simultaneously formed in the mask plate for forming the mask MSK by wet etching or the like.

Because the plurality of grooves GV positioned in the sensor area SA and the plurality of temporary grooves TGV positioned in the main deposition area MDA are simultaneously formed, the first area A1 of each of the plurality of grooves GV in the first surface S1 may be equal to a second area A2 of each of the plurality of temporary grooves TGV in the first surface S1. When necessary, the first area A1 of each of the plurality of grooves GV in the first surface S1 may be less than the second area A2 of each of the plurality of temporary grooves TGV in the first surface S1. The second area A2 of each of the plurality of temporary grooves TGV in the first surface S1 may be greater than the third area A3 of each of the plurality of through-holes TH in the second surface S2. When the plurality of grooves GV and the plurality of temporary grooves TGV are formed, a depth of each of the plurality of grooves GV and the plurality of temporary grooves TGV may be greater than half of the thickness between the first surface S1 and the second surface S2.

Next, portions corresponding to the plurality of temporary grooves TGV are removed from the second surface S2 opposite to the first surface S1 by a wet etching method or the like, and accordingly, the plurality of temporary grooves TGV may become the plurality of through-holes TH as shown in FIG. 11. Because a depth of each of the plurality of temporary grooves TGV is greater than half of the thickness between the first surface S1 and the second surface S2, the third area A3 of each of the through-holes TH in the second surface S2 is less than the second area A2 of each of the plurality of temporary grooves TGV in the first surface S1, the through-holes TH being formed by removing the portions corresponding to the plurality of temporary grooves TGV from the second surface S2 opposite to the first surface S1 by the wet etching method or the like. In addition, because the through-holes TH are formed by two times of etching, a protrusion is formed on the inner surface of each of the through-holes TH as shown in FIG. 11. The temporary grooves TGV are formed so that the depth of each of the plurality of temporary grooves TGV is greater than half of the thickness between the first surface S1 and the second surface S2, and thus, this protrusion is relatively positioned adjacent to the second surface S2 than the first surface S1.

In the case of the mask MSK manufactured as described above, the first surface S1 may be a surface of the mask MSK in a direction to a deposition source for a material for forming an emission layer, and the second surface S2 may be a surface of the mask MSK in a direction to an object on which the emission layer is to be deposited. This is to significantly reduce occurrence of defects caused by the shadow effect by allowing a protrusion formed on the inner surface of each of the through-holes TH as described above to be positioned adjacent to the object on which the emission layer is to be deposited.

In addition, when grooves GV positioned in the sensor area SA are formed, not forming the grooves GV together in the first surface S1 when forming the plurality of temporary grooves TGV in the first surface S1, and simultaneously forming the grooves GV in the second surface S2 when removing portions corresponding to the plurality of temporary grooves TGV from the second surface S2 opposite to the first surface S1 by the wet etching method or the like may also be considered. However, in this case, an area of a groove GV, in the second surface S2 is equal to the third area A3 of each of the through-holes TH in the second surface S2. In addition, a volume of the groove GV formed in the second surface S2 is less than a volume of the groove GV formed in the first surface S1.

As described above, in the mask MSK according to some embodiments, the plurality of through-holes TH are arranged in the main deposition area MDA, and the plurality of grooves GV arranged at regular intervals are present in the sensor area SA, and thus, a constant stress is applied to the mask MSK over the main deposition area MDA and the sensor area SA. For this, the volume of the grooves GV needs to be as close to the volume of the through-hole TH as possible. Accordingly, when the temporary grooves TGV are formed in the first surface S1, the grooves GV positioned in the sensor area SA need to be simultaneously formed in the first surface S1. Although the grooves GV positioned in the sensor area SA are formed in the first surface S1, as shown in FIG. 13 which is an enlarged backside view of an area of the mask MSK that may be used to manufacture the display apparatus of FIG. 1, an area of the groove GV in the first surface S1 may be less than an area of the through-hole TH in the first surface S1.

Figure 13:
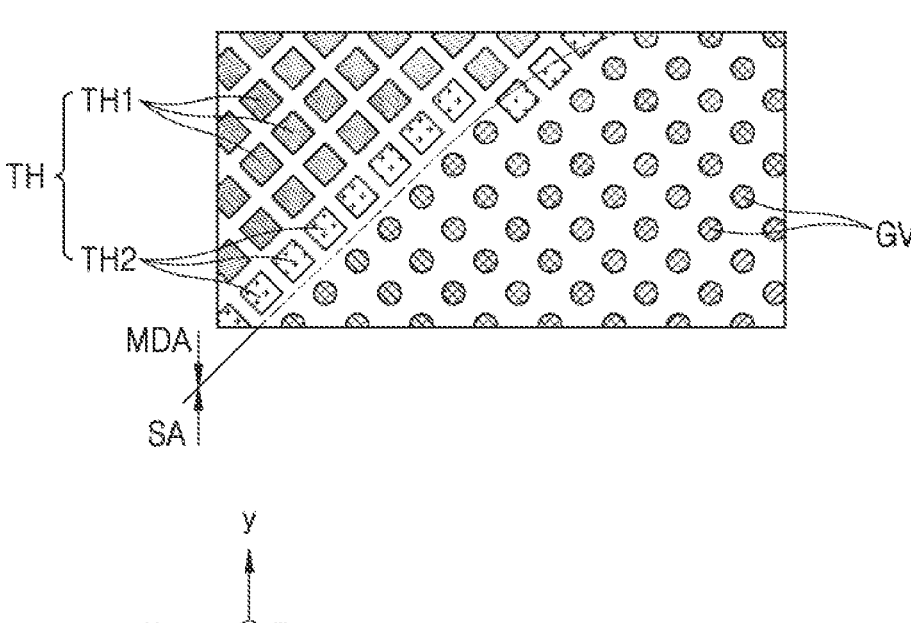
FIG. 13 is an enlarged backside view of an area of a mask that may be used to manufacture the display apparatus of FIG. 1.

As shown in FIGS. 10 and 13, a distance between the centers of the through-holes TH may be equal to a distance between the centers of the grooves GV. That is, an arrangement of the through-holes TH may be identical to an arrangement of the grooves GV, and the number of through-holes TH per unit area may be equal to the number of grooves GV per unit area. Accordingly, a constant stress may be applied to the mask MSK over the main deposition area MDA and the sensor area SA.

In addition, as shown in FIGS. 10 and 13, the second through-holes TH2 used to form dummy emission layers 222$b'$ may be arranged along an edge of the sensor area SA. Accordingly, the dummy emission layers 222$b'$ may be positioned around the opening 10OP of the display panel 10. As described above, an end of each of the dummy emission layers 222$b'$ positioned around the opening 10OP of the display panel 10 in a direction to the opening 10OP is not exposed by the opening 10OP. For reference, the entire lower surface of the dummy emission layer 222$b'$ in a direction (−z direction) of the substrate 100 is in contact with the pixel-defining layer 211 as shown in FIG. 6. This is because there is no pixel electrode corresponding to the dummy emission layer 222$b'$.

According to the one or more embodiments as described above, the mask for depositing the emission layer, in which a defect rate in a display apparatus manufacturing process may be reduced, the method of manufacturing the mask, and the display apparatus manufactured by the mask may be implemented. The scope of the disclosure is not limited to the above effects.

The disclosure has been described above with reference to the embodiments shown in the accompanying drawings, which are merely examples. Those of ordinary skill in the art can fully understand that various modifications and other equivalent embodiments may be made from the presented embodiments. Therefore, the true technical protection scope of the disclosure should be defined based on the technical idea of the appended claims.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims, and their equivalents.

What is claimed is:

1. A display apparatus comprising:
   a substrate including an opening, a display area, and an intermediate area, the display area being outside the opening to surround the opening, and the intermediate area being between the opening and the display area;
   a plurality of display elements over the display area, each of the plurality of display elements including a pixel electrode, an opposite electrode, and an emission layer between the pixel electrode and the opposite electrode;
   a pixel defining layer on the substrate, having a pixel opening formed therethrough, wherein the emission layer is in the pixel opening; and
   a dummy emission layer over the pixel defining layer in the intermediate area to be spaced apart from the emission layer, wherein an end of the dummy emission layer in a direction to the opening is not exposed by the opening.

2. The display apparatus of claim 1, further comprising a first functional layer over the display area and the intermediate area, between the pixel electrode and the emission layer in the display area, and including a first through-hole corresponding to the opening.

3. The display apparatus of claim 2, wherein an area of the first through-hole is equal to an area of the opening.

4. The display apparatus of claim 2, wherein an inner surface of the first through-hole and an inner surface of the opening form a continuous surface.

5. The display apparatus of claim 1, further comprising a second functional layer over the display area and the intermediate area, between the emission layer and the opposite electrode in the display area, and including a second through-hole corresponding to the opening.

6. The display apparatus of claim 5, wherein an area of the second through-hole is equal to an area of the opening.

7. The display apparatus of claim 5, wherein an inner surface of the second through-hole and an inner surface of the opening form a continuous surface.

8. The display apparatus of claim 1, wherein the dummy emission layer includes a plurality of dummy emission layers positioned around the opening.

9. The display apparatus of claim 1, wherein the dummy emission layer includes a plurality of dummy emission layers positioned around the opening, and an end of each of the dummy emission layers in the direction to the opening is not exposed by the opening.

10. The display apparatus of claim 1, further comprising a pixel-defining layer integrally formed as a single body over the display area and the intermediate area, and including a pixel opening that covers an edge of the pixel electrode and exposes the pixel electrode in the display area,
    wherein an entire lower surface of the dummy emission layer is in contact with the pixel-defining layer.

11. The display apparatus of claim 1, wherein the display apparatus is one of a smartphone, a mobile phone, a navigation apparatus, a game console, a television (TV), a vehicle head unit, a notebook computer, a laptop computer, a tablet computer, a personal media player (PMP), a personal digital assistant (PDA), a center fascia of a vehicle, a dashboard of the vehicle, or a room mirror display of the vehicle.

* * * * *